(12) United States Patent
Kalkanoglu et al.

(10) Patent No.: US 10,563,406 B2
(45) Date of Patent: Feb. 18, 2020

(54) ROOFING PRODUCTS HAVING RECEPTOR ZONES AND PHOTOVOLTAIC ROOFING ELEMENTS AND SYSTEMS USING THEM

(71) Applicants: Husnu M. Kalkanoglu, Swarthmore, PA (US); Gregory F. Jacobs, Oreland, PA (US); Wayne E. Shaw, Glen Mills, PA (US); Peter Chihlas, Lansdale, PA (US)

(72) Inventors: Husnu M. Kalkanoglu, Swarthmore, PA (US); Gregory F. Jacobs, Oreland, PA (US); Wayne E. Shaw, Glen Mills, PA (US); Peter Chihlas, Lansdale, PA (US)

(73) Assignee: CertainTeed Corporation, Malvern, PA (US)

( * ) Notice: Subject to any disclaimer, the term of this patent is extended or adjusted under 35 U.S.C. 154(b) by 1010 days.

(21) Appl. No.: 13/669,118

(22) Filed: Nov. 5, 2012

(65) Prior Publication Data

US 2013/0067852 A1    Mar. 21, 2013

Related U.S. Application Data

(63) Continuation of application No. 12/339,943, filed on Dec. 19, 2008, now abandoned.

(60) Provisional application No. 61/014,902, filed on Dec. 19, 2007, provisional application No. 61/043,707, filed on Apr. 9, 2008.

(51) Int. Cl.
*H01L 31/18*     (2006.01)
*E04D 13/00*    (2006.01)

(52) U.S. Cl.
CPC ............ *E04D 13/00* (2013.01); *H01L 31/18* (2013.01); *Y10T 29/49826* (2015.01); *Y10T 156/10* (2015.01)

(58) Field of Classification Search
CPC .......... E04D 5/02; E04D 13/00; Y02B 10/12; H01L 31/18; H02S 20/23; Y10T 156/10; Y10T 29/49826
See application file for complete search history.

(56) References Cited

U.S. PATENT DOCUMENTS 4,674,244 A * 6/1987 Francovitch ............ F24S 23/77
                                                       52/173.3
4,860,509 A    8/1989 Laaly et al.
(Continued)

FOREIGN PATENT DOCUMENTS

EP    0 747 971 A2    12/1996
GB    2438526 A       11/2007
(Continued)

*Primary Examiner* — Golam Mowla
(74) *Attorney, Agent, or Firm* — McDonnell Boehnen Hulbert & Berghoff LLP

(57) ABSTRACT

The present invention relates generally to roofing products. The present invention relates more particularly to roofing products for use with photovoltaic elements, and to photovoltaic systems that include one or more photovoltaic elements is joined to a roofing substrate. In one embodiment, a roofing product includes a flexible roofing substrate having a top surface, the top surface having one or more receptor zones thereon, each receptor zone being adapted to receive one or more photovoltaic elements, each receptor zone having a different surfacing than the area of the top surface adjacent to it.

19 Claims, 13 Drawing Sheets

(56) References Cited

U.S. PATENT DOCUMENTS

| | | | | |
|---|---|---|---|---|
| 6,072,115 | A * | 6/2000 | Inoue | H01L 31/048 |
| | | | | 136/244 |
| 6,242,685 | B1 * | 6/2001 | Mizukami | E04D 12/004 |
| | | | | 136/244 |
| 6,245,987 | B1 * | 6/2001 | Shiomi | H01L 31/048 |
| | | | | 136/244 |
| 6,269,596 | B1 * | 8/2001 | Ohtsuka | E04D 3/366 |
| | | | | 52/173.3 |
| 6,295,818 | B1 * | 10/2001 | Ansley | F24S 20/50 |
| | | | | 60/641.8 |
| 6,311,436 | B1 * | 11/2001 | Mimura | E04D 1/365 |
| | | | | 52/173.3 |
| 6,553,729 | B1 | 4/2003 | Nath et al. | |
| 6,729,081 | B2 | 5/2004 | Nath et al. | |
| 7,102,074 | B2 * | 9/2006 | Yen | H02S 20/23 |
| | | | | 136/244 |
| 7,342,171 | B2 | 3/2008 | Khouri et al. | |
| 7,506,477 | B2 * | 3/2009 | Flaherty | E04D 1/08 |
| | | | | 52/173.3 |
| 2001/0054262 | A1 | 12/2001 | Nath et al. | |
| 2002/0112419 | A1 | 8/2002 | Dorr et al. | |
| 2003/0034064 | A1 * | 2/2003 | Hatsukaiwa | H02S 20/23 |
| | | | | 136/251 |
| 2004/0011354 | A1 * | 1/2004 | Erling | H02S 20/23 |
| | | | | 126/621 |
| 2004/0144043 | A1 | 7/2004 | Stevenson et al. | |
| 2005/0072456 | A1 | 4/2005 | Stevenson et al. | |
| 2005/0178428 | A1 | 8/2005 | Laaly et al. | |
| 2005/0178429 | A1 | 8/2005 | McCaskill et al. | |
| 2006/0137733 | A1 | 6/2006 | Schripsema et al. | |
| 2006/0207645 | A1 | 9/2006 | Wada | |
| 2008/0098672 | A1 * | 5/2008 | O'Hagin | E04D 1/30 |
| | | | | 52/173.3 |
| 2008/0236653 | A1 | 10/2008 | Kelly | |
| 2008/0245404 | A1 | 10/2008 | DeLiddo | |
| 2008/0245405 | A1 | 10/2008 | Garvison et al. | |
| 2008/0302030 | A1 | 12/2008 | Stancel et al. | |
| 2009/0132497 | A1 | 5/2009 | Nagai | |

FOREIGN PATENT DOCUMENTS

| | | |
|---|---|---|
| JP | 11-50607 | 2/1999 |
| JP | 2001-332752 | 11/2001 |
| WO | 01/94719 A1 | 12/2001 |
| WO | 2006121433 A1 | 11/2006 |
| WO | 2008073905 A2 | 6/2008 |
| WO | 2008137966 A2 | 11/2008 |
| WO | 2009095762 A1 | 8/2009 |

* cited by examiner

ROOFING PRODUCTS HAVING RECEPTOR ZONES AND PHOTOVOLTAIC ROOFING ELEMENTS AND SYSTEMS USING THEM

CROSS-REFERENCE TO RELATED APPLICATIONS

This application is a continuation of U.S. patent application Ser. No. 12/339,343, filed Dec. 19, 2008, which claims priority under 35 U.S.C. §119(e) to U.S. Provisional Patent Applications Ser. No. 61/014,902, filed Dec. 19, 2007, and to Ser. No. 61/043,707, filed Apr. 9, 2008, each of which is hereby incorporated herein by reference in its entirety.

BACKGROUND OF THE INVENTION

1. Field of the Invention

The present invention relates generally to roofing products. The present invention relates more particularly to roofing products for use with photovoltaic elements, and to photovoltaic systems that include one or more photovoltaic elements joined to a roofing substrate.

2. Technical Background

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as device performance has improved. They can be used to provide at least a significant fraction of the electrical energy needed for a building's overall function; or they can be used to power one or more particular devices, such as exterior lighting systems.

Photovoltaic cells can be packaged as photovoltaic elements, in which one or more photovoltaic cells are electrically interconnected and provided in a common package. One common type of photovoltaic element is an encapsulated photovoltaic element, in which the photovoltaic cells are packaged together in between layers of layer material. The layer materials are often chosen to be highly light-transmissive, and to retain their transmissivity over time. Encapsulated photovoltaic elements can be convenient for integration with various substrates.

Roofing products in which a photovoltaic element is integrated with a roofing substrate (such as a shingle or tile) have been proposed. Such "photovoltaic roofing elements" (also known as "roofing-integrated photovoltaics" or "RIPV") can provide both protection from the elements and power generation capability in a single product. Moreover, photovoltaic roofing elements can provide aesthetic benefit, as they can be made to blend with the architecture of the overall roof much better than can conventional photovoltaic modules.

Encapsulated photovoltaic elements can be convenient for integration with various substrates. However, in many circumstances, formation of a long-lived physical connection between the material of the encapsulated photovoltaic element and the material of a substrate can be difficult, especially when the materials used to make the encapsulated photovoltaic element have low surface tension. Notably, the surfaces used as the top layer of many roofing substrates, such as the coated granules typically used with bituminous roofing products, can be less than optimal for adhesion to a photovoltaic element.

One disadvantage to the use of photovoltaic roofing elements is that they can require special skills and tools for installation, making them challenging for installation by a roofing professional. Moreover, once installed on a roof, they can be relatively susceptible to damage. Accordingly, at any point after a roof has photovoltaic roofing elements installed thereon, it can be more difficult for workers to perform any other necessary tasks on the roof.

There remains a need for roofing products and photovoltaic roofing systems that can address these deficiencies.

SUMMARY OF THE INVENTION

One aspect of the present invention is a roofing product including:
  a flexible roofing substrate having a top surface, the top surface having one or more receptor zones thereon, each receptor zone being adapted to receive one or more photovoltaic elements, each receptor zone having a different surfacing than the area of the top surface adjacent to it.

Another aspect of the present invention is a photovoltaic roofing element including:
  a flexible roofing substrate having a top surface, the top surface having one or more receptor zones thereon, each receptor zone being adapted to receive one or more photovoltaic elements, each receptor zone having a different surfacing than the area of the top surface adjacent to it; and
  one or more photovoltaic elements disposed in the one or more receptor zones of the top surface of the flexible roofing substrate.

Another aspect of the present invention is a photovoltaic roofing system comprising one or more photovoltaic roofing elements as described above disposed on a roof deck.

Another aspect of the present invention is a method for installing a photovoltaic roofing system, the method comprising:
  installing on a roof deck a flexible roofing substrate having a top surface, the top surface having one or more receptor zones thereon, each receptor zone being adapted to receive one or more photovoltaic elements, each receptor zone having a different surfacing than the area of the top surface adjacent to it; then
  disposing the one or more photovoltaic elements on the one or more receptor zones of the top surface of the flexible roofing substrate.

Another aspect of the present invention is a kit for the installation of a photovoltaic roofing system, the kit comprising:
  one or more flexible roofing substrates having a top surface, the top surface having one or more receptor zones thereon, each receptor zone being adapted to receive one or more photovoltaic elements, each receptor zone having a different surfacing than the area of the top surface adjacent to it; and one or more photovoltaic elements.

The products, elements, systems, methods and kits of the present invention can result in a number of advantages. For example, in some embodiments, the products and systems of the present invention can provide enhanced adhesion between the photovoltaic element and the flexible roofing substrate. In other examples, the methods of the present invention can be used to install a photovoltaic roofing system so that the installation of the relatively rugged flexible roofing substrate can be performed by a roofing professional, and the more fragile photovoltaic elements can be installed much later, by a person skilled in electrical interconnections. Other advantages will be apparent to the person of skill in the art.

The accompanying drawings are not necessarily to scale, and sizes of various elements can be distorted for clarity.

DETAILED DESCRIPTION OF THE INVENTION

Figure 1:
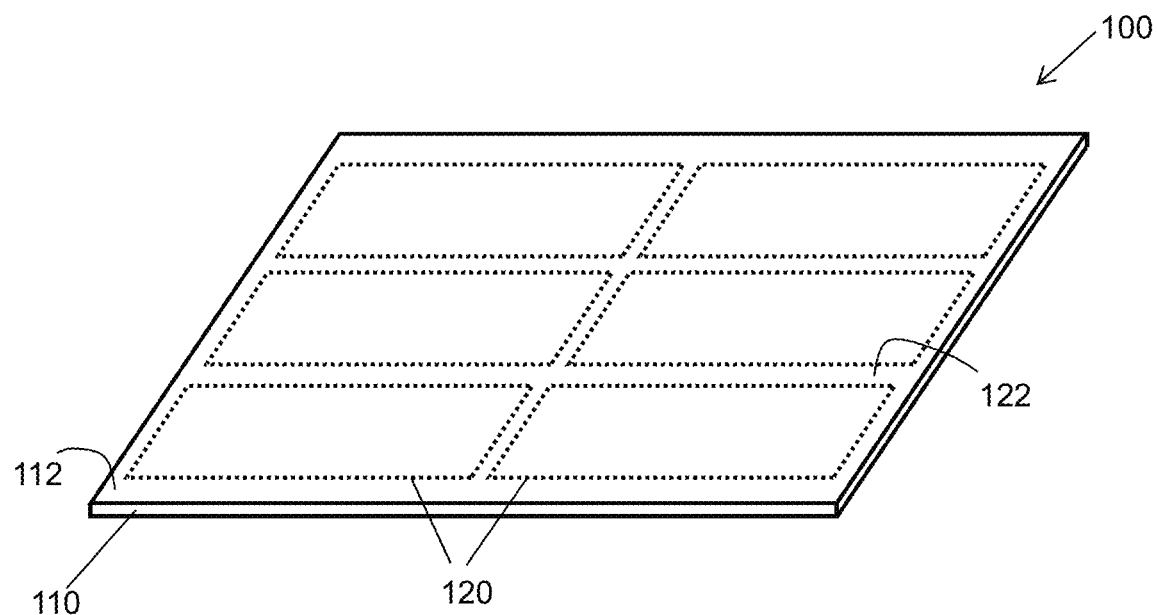
FIG. 1 is a schematic perspective view of a roofing product according to one embodiment of the invention.

One embodiment of a roofing product according to the present invention is shown in schematic perspective view in FIG. 1. Roofing product 100 comprises a flexible roofing substrate 110 having a top surface 112. One or more (in this embodiment, six) receptor zones 120 are on the top surface 112 of flexible roofing substrate 110. Each receptor zone 120 is adapted to receive one or more photovoltaic elements, and has a different surfacing than the area 122 of the top surface adjacent to the receptor zone 120. The sizes and shapes of the one or more receptor zones can, for example, be selected based on the sizes and shapes of the photovoltaic elements envisioned for use therewith. For example, certain photovoltaic elements available from Uni-solar Ovonic have dimensions of about 12 cm×18 cm (T-Cells); about 24 cm×36 cm (L-Cells); or about 40 cm×5 m (strip).

In some embodiments, the receptor zone has dimensions that are somewhat larger than (e.g., in the range of 101-120% of, or even 101-110% of) the dimensions of the photovoltaic elements with which they are to be used. Such embodiments can be more user-friendly, as precise alignment is not necessary for an installer to accurately place the photovoltaic element completely within the receptor zone. In certain embodiments, when an elongated photovoltaic element is used, such as the strips available from Uni-solar Ovonic, minor angular misalignments can be tolerated.

Photovoltaic elements suitable for use in conjunction with the roofing products of the invention, and in the photovoltaic roofing elements, systems, methods and kits of the invention comprise one or more interconnected photovoltaic cells provided together in a single package. The photovoltaic cells of the photovoltaic elements can be based on any desirable photovoltaic material system, such as monocrystalline silicon; polycrystalline silicon; amorphous silicon; III-V materials such as indium gallium nitride; II-VI materials such as cadmium telluride; and more complex chalcogenides (group VI) and pnicogenides (group V) such as copper indium diselenide. For example, one type of suitable photovoltaic cell includes an n-type silicon layer (doped with an electron donor such as phosphorus) oriented toward incident solar radiation on top of a p-type silicon layer (doped with an electron acceptor, such as boron), sandwiched between a pair of electrically-conductive electrode layers. Another type of suitable photovoltaic cell is an indium phosphide-based thermo-photovoltaic cell, which has high energy conversion efficiency in the near-infrared region of the solar spectrum. Thin film photovoltaic materials and flexible photovoltaic materials can be used in the construction of photovoltaic elements for use in the present invention. In one embodiment of the invention, the photovoltaic element includes a monocrystalline silicon photovoltaic cell or a polycrystalline silicon photovoltaic cell. The photovoltaic elements for use in the present invention can be flexible, or alternatively can be rigid.

The photovoltaic elements can be encapsulated photovoltaic elements, in which photovoltaic cells are encapsulated between various layers of material. For example, an encapsulated photovoltaic element can include a top layer material at its top surface, and a bottom layer material at its bottom surface. The top layer material can, for example, provide environmental protection to the underlying photovoltaic cells, and any other underlying layers. Examples of suitable materials for the top layer material include fluoropolymers, for example ETFE ("TEFZEL"), PFE, FEP, PVF ("TEDLAR"), PCTFE or PVDF. The top layer material can alternatively be, for example, a glass sheet, or a non-fluorinated polymeric material. The bottom layer material can be, for example, a fluoropolymer, for example ETFE ("TEFZEL"), PFE, FEP, PVDF or PVF ("TEDLAR"). The bottom layer material can alternatively be, for example, a polymeric material (e.g., polyester such as PET); or a metallic material (e.g., steel or aluminum sheet).

Figure 2:
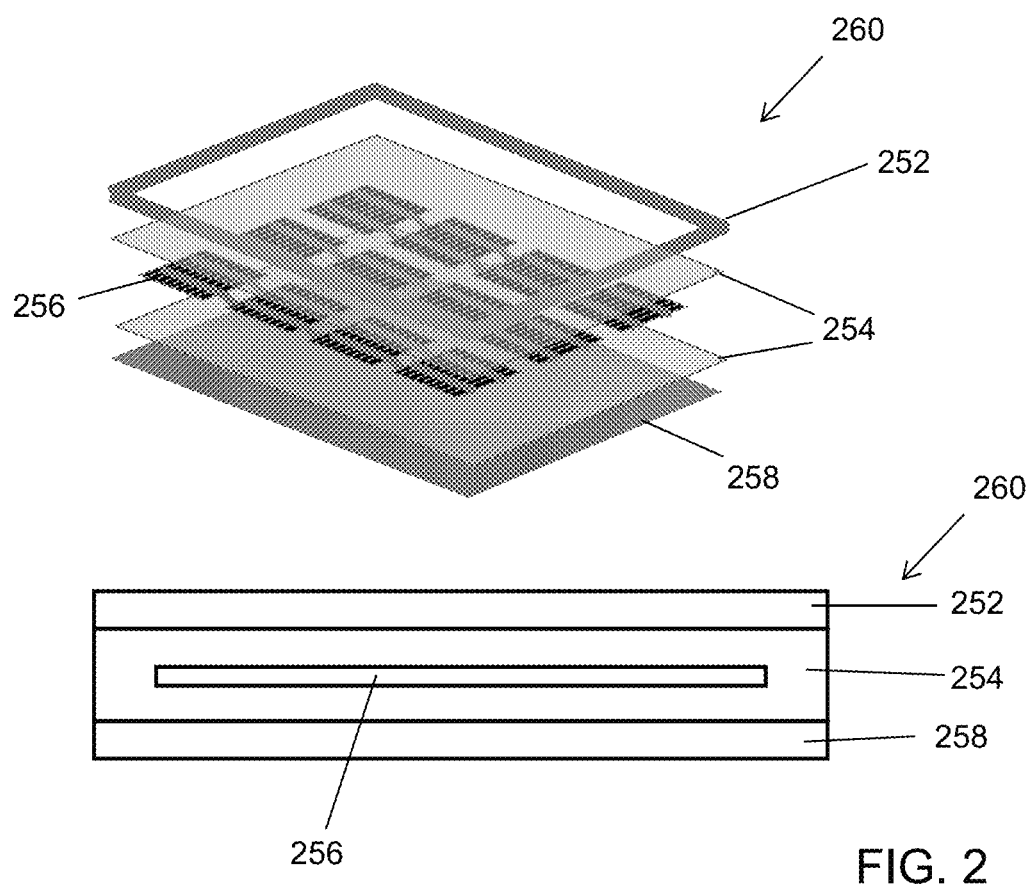
FIG. 2 is a schematic exploded view and a schematic cross-sectional view of an encapsulated photovoltaic element suitable for use in the present invention.

As the person of skill in the art will appreciate, an encapsulated photovoltaic element can include other layers interspersed between the top layer material and the bottom layer material. For example, an encapsulated photovoltaic element can include structural elements (e.g., a reinforcing layer of glass, metal or polymer fibers, or a rigid film); adhesive layers (e.g., EVA to adhere other layers together); mounting structures (e.g., clips, holes, or tabs); one or more electrical connectors (e.g., electrodes, electrical connectors; optionally connectorized electrical wires or cables) for electrically interconnecting the photovoltaic cell(s) of the encapsulated photovoltaic element with an electrical system. An example of an encapsulated photovoltaic element suitable for use in the present invention is shown in schematic exploded view and schematic cross sectional view in FIG. 2. Encapsulated photovoltaic element 260 includes a top protective layer 252 (e.g., glass or a fluoropolymer film such as ETFE, PVDF, PVF, FEP, PFA or PCTFE); encapsulant layers 254 (e.g., EVA, functionalized EVA, crosslinked EVA, silicone, thermoplastic polyurethane, maleic acid-modified polyolefin, ionomer, or ethylene/(meth)acrylic acid copolymer); a layer of electrically-interconnected photovoltaic cells 256; and a backing layer 258 (e.g., PVDF, PVF, PET).

A photovoltaic element having a self-adhesive layer on its bottom surface can be suitable for use in the present invention (e.g., it can be adhered in the receptor zone). In one example, the self-adhesive layer is a 3-10 mil thick layer of a butyl rubber-based or rubber resin pressure sensitive adhesive. Suitable rubber resin pressure sensitive adhesives are disclosed, for example, in U.S. Pat. No. 3,451,537, which is hereby incorporated herein by reference. In certain embodiments, the adhesive package on the bottom surface of the photovoltaic element has a composite structure comprising a layer of pressure sensitive adhesive and a layer of deformable material. The deformable material can allow for more economical usage of a higher performance, higher cost pressure sensitive adhesive. The use of deformable layers to improve contact between pressure sensitive adhesives and irregular surfaces is disclosed in U.S. Pat. No. 5,310,278, which is hereby incorporated herein by reference in its entirety. The self-adhesive layer can be protected with a releasable liner; the releasable liner can be removed (e.g., by peeling) to expose the adhesive for attachment to the receptor zone of a flexible roofing substrate.

The photovoltaic element can include at least one antireflection coating, for example as the top layer material in an encapsulated photovoltaic element, or disposed between the top layer material and the photovoltaic cells.

Suitable photovoltaic elements can be obtained, for example, from China Electric Equipment Group of Nanjing, China, as well as from several domestic suppliers such as Uni-Solar Ovonic, Sharp, Shell Solar, BP Solar, USFC, FirstSolar, General Electric, Schott Solar, Evergreen Solar and Global Solar. Moreover, the person of skill in the art can fabricate encapsulated photovoltaic elements using techniques such as lamination or autoclave processes. Encapsulated photovoltaic elements can be made, for example, using methods disclosed in U.S. Pat. No. 5,273,608, which is hereby incorporated herein by reference.

The top surface of photovoltaic element is the surface presenting the photoelectrically-active areas of its one or more photoelectric cells. When installed, the photovoltaic roofing elements of the present invention should be oriented so that the top surface of the photovoltaic element is able to be illuminated by solar radiation. The bottom surface is the surface opposite the top surface.

The photovoltaic element also has an operating wavelength range. Solar radiation includes light of wavelengths spanning the near UV, the visible, and the near infrared spectra. As used herein, the term "solar radiation," when used without further elaboration means radiation in the wavelength range of 300 nm to 2500 nm, inclusive. Different photovoltaic elements have different power generation efficiencies with respect to different parts of the solar spectrum. Amorphous doped silicon is most efficient at visible wavelengths, and polycrystalline doped silicon and monocrystalline doped silicon are most efficient at near-infrared wavelengths. As used herein, the operating wavelength range of a photovoltaic element is the wavelength range over which the relative spectral response is at least 10% of the maximal spectral response. According to certain embodiments of the invention, the operating wavelength range of the photovoltaic element falls within the range of about 300 nm to about 2000 nm. In certain embodiments of the invention, the operating wavelength range of the photovoltaic element falls within the range of about 300 nm to about 1200 nm.

The surfacing of the one or more receptor zones can be adapted to provide increased adhesion between the flexible roofing substrate and a photovoltaic element (for example, an encapsulated roofing element). Accordingly, the receptor zones can provide areas of increased adhesion for photovoltaic elements, while the remainder of the top surface of the flexible roofing substrate can be surfaced to provide, for example, weather resistance, UV resistance, solar reflectivity, a color or appearance complementary to photovoltaic elements or adjacent areas of the flexible roofing substrate, or other desirable properties.

For example, in one embodiment of the invention, the surfacing of the receptor zones is textured. The surfacing can include, for example, a textured layer such as a fabric, scrim, a woven or non-woven web, a felt, a porous film, or a sheet having a microstructured surface. In other embodiments, the surfacing includes a texturing material such as sand, glass or quartz grit, fibers (e.g., polymeric, glass). The textured layer can provide additional surface area for adhesion of the encapsulated photovoltaic element to the flexible roofing substrate. In certain embodiments of the invention, the textured layer can intermingle with the materials of an encapsulated photovoltaic element, the flexible roofing substrate, and/or an adhesive material in order to improve adhesion through mechanical interlocking A textured layer can be especially useful in conjunction with a bituminous roofing substrate; during fabrication, the textured layer can embed itself in the softened bituminous material. Similarly, a textured layer can be useful in conjunction with a polymeric roofing substrate, embedding itself in the polymeric material through use of heat and/or pressure. In certain embodiments of the invention, the textured layer is a fibrous layer (e.g., scrim, fabric, non-woven web). Textured layers are described in more detail in U.S. Patent Application Publication no. 2008/0248241, which is hereby incorporated herein by reference in its entirety. In certain embodiments of the invention, the material of the textured layer is at least partially embedded in the material of the top surface of the flexible roofing substrate. For example, in one embodiment, the surfacing includes a textured web (e.g., fiberglass mat)

coated on one side (e.g., with a polymeric coating), with its uncoated side embedded in the material of the top surface of the flexible roofing substrate (e.g., a bituminous roofing substrate) in the receptor zone. In this embodiment, the coating can provide increased adhesion to a photovoltaic element, while the embedded textured web improves adhesion to the flexible roofing substrate. In other embodiments of the invention, the textured surfacing is achieved by mechanically embossing or chemically etching the top surface of the flexible roofing substrate in the receptor zone.

Figure 3:
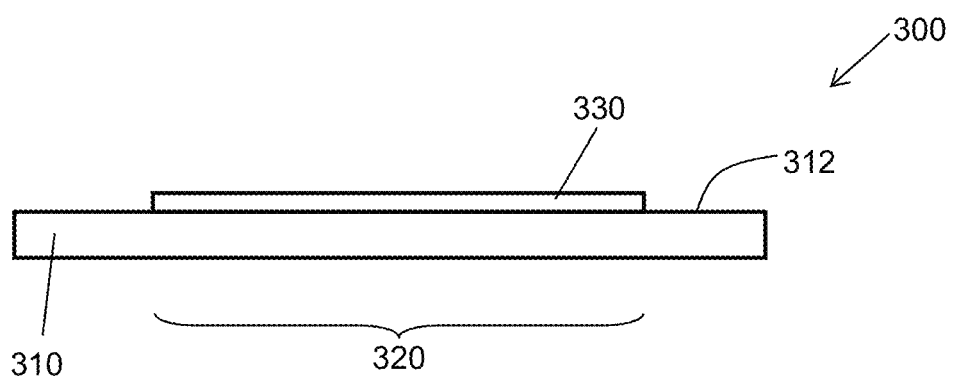
FIG. 3 is a partial schematic cross-sectional view of a roofing product according to another embodiment of the invention.

In other embodiments of the invention, the surfacing of the one or more receptor zones includes a polymer material or a metal foil. For example, as shown in partial schematic cross-sectional view in FIG. 3, roofing product 300 includes flexible roofing substrate 310, which has top surface 312. Disposed on the top surface 312 in the receptor zone 320 is a polymer material 330 (e.g., in film form). The polymer material or metal foil can provide enhanced adhesion to a photovoltaic element (e.g., through a tie layer system such as an adhesive layer, as described below). For example, the surfacing can be a polymer film formed from a polymer such as a fluorinated polymer, an acrylic polymer, a urethane polymer, a polyester, or a polyolefin. In other embodiments, the surfacing of the one or more receptor zones includes a metal foil, such as an aluminum foil or a steel foil. For example, in one embodiment, 2 mil thickness deadsoft aluminum foil available from Kaiser aluminum is laminated to portions of the surface of a bituminous roofing membrane prior to the application of roofing granules thereto. The polymer film or metal foil can be surface-treated (e.g., as described below) to enhance adhesion.

Figure 4:
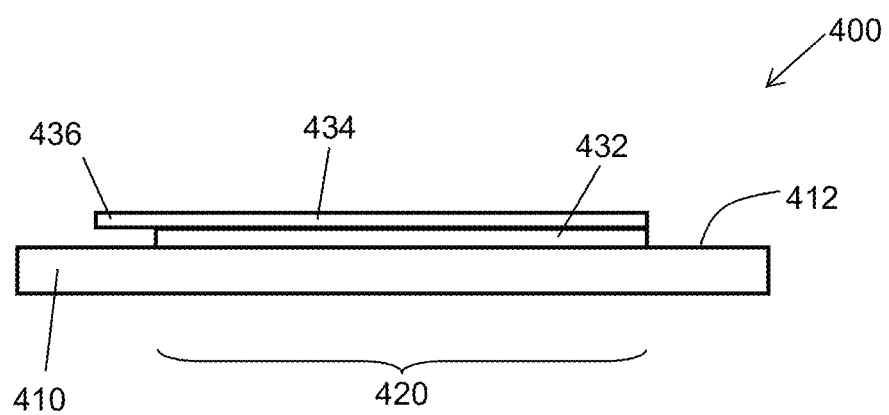
FIG. 4 is a partial schematic cross-sectional view of a roofing product according to another embodiment of the invention.

In another embodiment, the surfacing of the one or more receptor zones includes an adhesive material covered by a releasable liner. For example, as shown in partial schematic cross-sectional view in FIG. 4, roofing product 400 includes flexible roofing substrate 410, which has top surface 412. Disposed on the top surface 412 in the receptor zone 420 is an adhesive material 432 covered by a releasable liner 434. In such embodiments, the releasable liner can be removed (e.g., by peeling using pull tab 436) to expose the adhesive material, which can be used to affix a photovoltaic element to the receptor zone. The releasable liner can be, for example, release-coated paper. The adhesive material can be, for example, a pressure sensitive adhesive such as a functionalized EVA-based pressure-sensitive adhesive (e.g., HP Fuller 9917).

Figure 5:
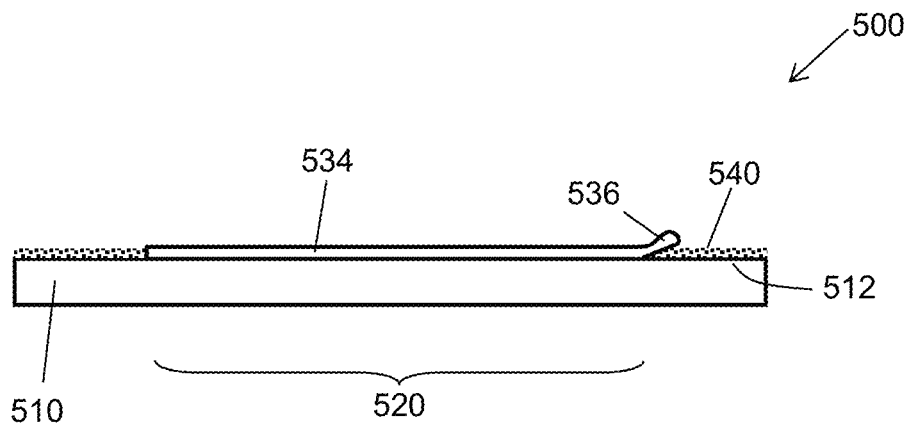
FIG. 5 is a partial schematic cross-sectional view of a roofing product according to another embodiment of the invention.

In another embodiment, the surfacing of the one of more receptor zones includes uncoated bituminous material covered by a releasable liner. For example, as shown in partial schematic cross-sectional view in FIG. 5, roofing product 500 includes bituminous roofing substrate 510 (e.g., a glass-reinforced bituminous membrane or shingle), which has top surface 512. The top surface 512 is coated with roofing granules 540 in areas outside the receptor zone 520. In receptor zone 520, the top surface is not coated with granules, but instead is left uncoated and covered by releasable liner 534 (which can optionally include a pull tab 536). In certain embodiments, the uncoated bituminous material, when exposed by removing the release liner, can provide sufficient adhesive character to directly adhere a photovoltaic element in the receptor zone. In other embodiments, a tie layer system (e.g., an adhesive layer) can be used to adhere the photovoltaic element to the receptor zone.

In some embodiments of the invention, the surfacing of the one or more receptor zones is selected so that the appearance of the receptor zone is complementary to the top surface of the flexible roofing substrate in the area adjacent to the receptor zone. As used herein $L^*$, $a^*$ and $b^*$ are the color measurements for a given sample using the 1976 CIE color space. The strength in color space $E^*$ is defined as $E^*=(L^{*2}+a^{*2}+b^{*2})^{1/2}$. The total color difference $\Delta E^*$ between two articles is defined as $\Delta E^*=(\Delta L^{*2}+\Delta a^{*2}+\Delta b^{*2})^{1/2}$, in which $\Delta L^*$, $\Delta a^*$ and $\Delta b^*$ are respectively the differences in $L^*$, $a^*$ and $b^*$ for the two articles. $L^*$, $a^*$ and $b^*$ values are measured using a HunterLab Model Labscan XE spectrophotometer using a 0° viewing angle, a 45° illumination angle, a 10° standard observer, and a D-65 illuminant. Lower $L^*$ values correspond to relatively darker tones. In such embodiments, if part or all of a receptor zone is not covered by a photovoltaic element, it can complement the rest of the surface of the flexible roofing substrate. In certain embodiments of the invention, the receptor zone has a $\Delta E^*<30$ compared to the top surface of the flexible roofing substrate in the area adjacent to the receptor zone. In some embodiments, the receptor zone has a $\Delta E^*<20$ compared to the top surface of the flexible roofing substrate in the area adjacent to the receptor zone.

In other embodiments, the flexible roofing substrate is an asphalt shingle substrate, and the surfacing of the one or more receptor zones is selected so that the receptor zone is black. In such embodiments, if part or all of a receptor zone is not covered by a photovoltaic element, it can complement the black color of the asphalt shingle substrate.

In other embodiments, the surfacing of the one or more receptor zones is selected so that the appearance of the receptor zone is complementary to the photovoltaic element with which the roofing product is to be used. In such embodiments, if part or all of a receptor zone is not covered by a photovoltaic element, it can complement the photovoltaic element disposed thereon, or photovoltaic elements disposed on neighboring receptor zones. For example, in certain embodiments of the invention, the receptor zone has a $\Delta E^*<30$ compared to the photovoltaically active surface of the photovoltaic element. In some embodiments, the receptor zone has a $\Delta E^*<20$ compared to the photovoltaically active surface of the photovoltaic element.

In embodiments in which the surfacing of the one or more receptor zones are selected to provide appearance complementary to some other aspect of the flexible roofing substrate or a photovoltaic element, the receptor zone can be provided with a desired appearance, for example, through printing or coating. When the receptor zone includes an aluminum foil, a desired appearance can in some embodiments be provided by anodization.

In some embodiments, the surfacing of the receptor zone is stabilized to UV radiation, for example through UV stabilization or through use of UV-resistant materials. In such embodiments, when the receptor zone is not completely occluded by photovoltaic elements, any exposed surface is resistant to UV damage. Such embodiments are especially useful when the flexible roofing substrate is formed from bituminous material. For example, the surfacing may include ETFE, PVC, acrylic or another UV-resistant polymer film, for example including UV stabilizers and/or antioxidants. Metal foil is opaque to UV, and can alternatively be used. UV-opaque particles can also be used; in such embodiments, it is preferable that such particles have substantially complete coverage over the surface of the receptor zone. For example, in one embodiment, the surface of the receptor zone is at least partially covered by small granules, for example roofing granules of #18 or #22 size, so that any areas of the receptor zone that are not blocked by a photovoltaic element are protected from UV damage.

In certain embodiments, the surfacing of the receptor zone is both stabilized to UV radiation and selected so that the appearance of the receptor zone is complementary to the photovoltaic element with which the roofing product is to be used, adjacent areas of the flexible roofing substrate, or is black, as described above. In such embodiments, any portion of the receptor zone that remains exposed can be UV resistant and complementary in appearance to other parts of the flexible roofing substrate or the photovoltaic elements used therewith.

Figure 6:
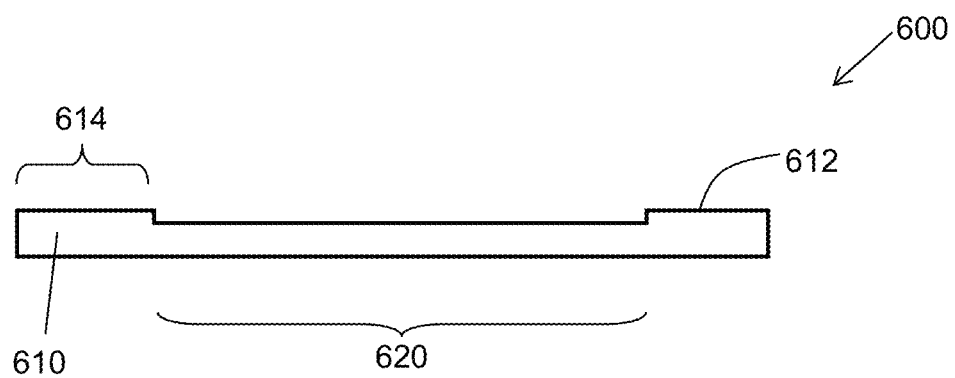
FIG. 6 is a partial schematic cross-sectional view of a roofing product according to another embodiment of the invention.

In certain embodiments of the invention, the top surface of the flexible roofing substrate in the receptor zone is recessed from the top surface of the flexible roofing substrate in the area adjacent to the receptor zone. For example, as shown in partial schematic cross-sectional view in FIG. 6, roofing product 600 includes flexible roofing substrate 610, which has a top surface 612. The top surface of the flexible roofing substrate in the receptor zone 620 is recessed from the top surface of the flexible roofing substrate in the area 614 adjacent to the receptor zone 620. In certain such embodiments, when a photovoltaic element is disposed in the receptor zone, its top surface can be substantially flush with the top surface of the area adjacent to the receptor zone.

In some embodiments of the invention, the surfacing of the one or more receptor zones includes one or more alignment marks (e.g., printed or embossed) to aid in the alignment and installation of a photovoltaic element. For example, the alignment marks can correspond with the visible separations between sets of photovoltaic cells in the photovoltaic element. In other embodiments, the alignment marks can correspond with markings formed on the top surface and/or the bottom surface (e.g., the bottom surface of an adhesive layer) of the photovoltaic element. In other embodiments, the alignment marks can correspond to markings formed on a surface of a releasable liner (e.g., the surface in contact with an adhesive layer, or the bottom surface); as the releasable liner is removed to expose the adhesive layer (e.g., when the photovoltaic element is supplied in roll form), the installer can use it as a guide to ensure alignment of the photovoltaic element to the receptor zone. The use of alignment marks can be especially useful when using photovoltaic elements in strip form, as the potential for alignment is higher for long, thin strips (e.g., Uni-Solar Ovonic strip photovoltaic element). The use of alignment marks in the receptor zone can be especially useful when the photovoltaic element is smaller than the receptor zone, so that the alignment marks are visible when the photovoltaic element is disposed thereon.

In other embodiments, the flexible roofing substrate includes one or more alignment marks (e.g., printed or embossed) in the area adjacent the receptor zone to aid in the alignment and installation of a photovoltaic element. The alignment marks can be as described above for the alignment marks in the receptor zone. For example, the alignment marks can correspond with the visible separations between sets of photovoltaic cells in the photovoltaic element. In other embodiments, the alignment marks can correspond with markings formed on the top surface of the photovoltaic element. When the flexible roofing substrate is a shingle, the alignment marks can be, for example, in the headlap area. When the flexible roofing substrate is a shingle, the alignment marks can be, for example, in the headlap area.

In certain embodiments, the top surface of the flexible roofing substrate has solar reflective properties, through a solar reflective coating or solar reflective roofing granules (see U.S. Pat. No. 7,241,500, which is hereby incorporated by reference in its entirety). Solar reflectance can reduce the effective temperature of the roof surface, which can improve the efficiency of power generation of the photovoltaic elements disposed thereon, as described in U.S. patent application Ser. No. 12/266,481, which is hereby incorporated herein by reference in its entirety. In some such embodiments, the top surface of the flexible roofing substrate does not have solar reflective properties in the one or more receptor zones, resulting in more economical use of solar reflective coating or solar reflective roofing granules. Similarly, in some embodiments, the solar reflective properties do not extend to areas of the flexible roofing substrate which are not visible when installed (e.g., the headlap region of a shingle, or the selvage region of a roofing membrane).

Figure 7:
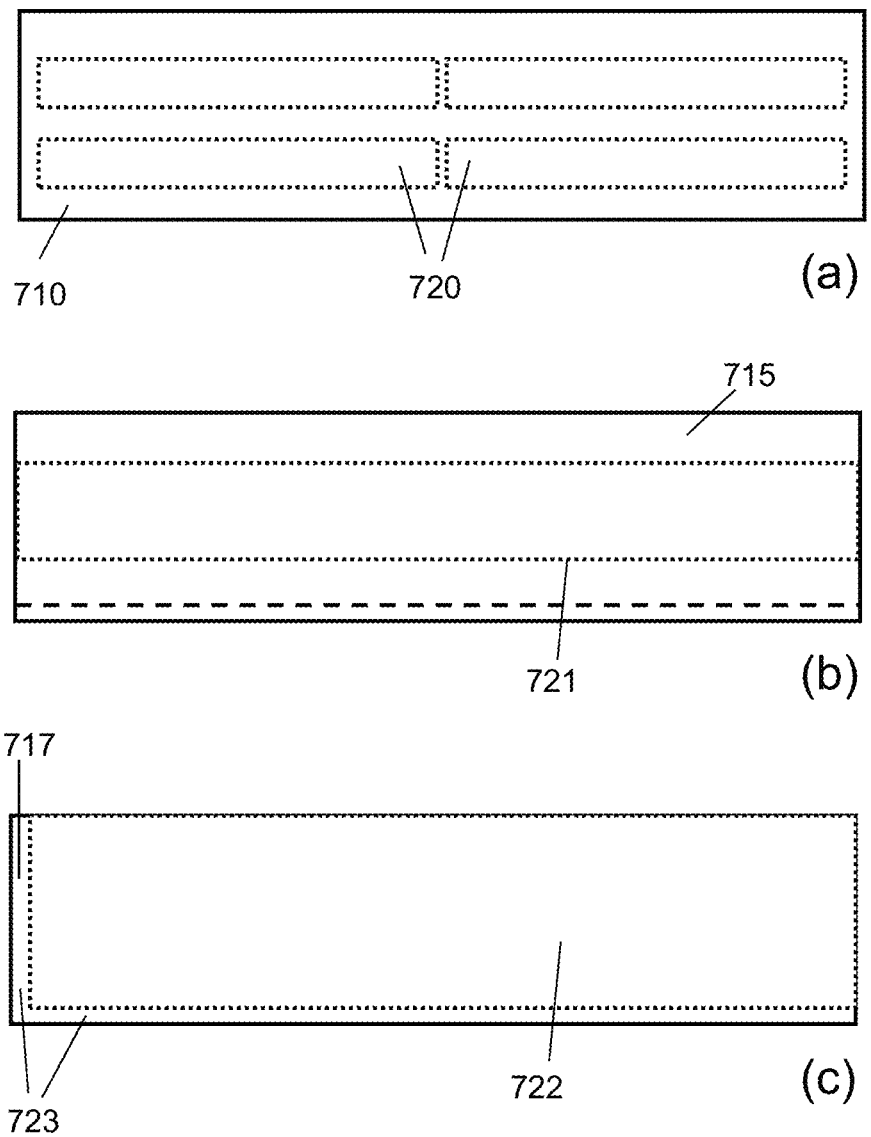
FIG. 7 is top schematic view of roofing products according to other embodiments of the invention.

The one or more receptor zones can be provided on the flexible roofing substrate in a wide variety of geometries. For example, they can be provided as islands or isolated zones; or alternatively can extend the length of a flexible roofing substrate. For example, in one embodiment, as shown in FIG. 7(*a*), the receptor zones 720 are formed as isolated zones on the top surface of a roofing membrane 710. In another embodiment, as shown in FIG. 7(*b*), a receptor zone 721 is formed to continuously extend along the length of a roofing membrane 715, as shown in FIG. 7(*b*). In other embodiments, the receptor zone 722 is formed to cover the entire surface of a roofing membrane 717 except for one or more selvage zones 723 formed along one or more edges, as shown in FIGS. 7(*b*) and 7(*c*).

In one embodiment, the flexible roofing substrate is a roofing membrane, such as the type used in multiple layer or built-up roofing systems. In such embodiments, the flexible roofing substrate can be provided, for example, as elongated sheets, which can be transported to the worksite in roll form. The roofing membrane can be, for example, formed from a bituminous material, and can be reinforced with fibers, glass mat, felt, or fabric, and coated with roofing granules (e.g., in areas outside of the receptor zones). In other embodiments, the roofing membrane can be formed from a rubber or polymeric material. Installation of the membrane can be performed through a variety of mechanical fasteners, adhesives, torching, or any other suitable methods. Adjacent sheets of roofing membrane can be sealed together where they adjoin. The roofing membranes of the present invention can be installed together with conventional roofing membrane products, to provide only certain areas of the roof with photovoltaic power generation capability. Roofing membranes can be formed, for example, from a single sheet of material with different surfacings formed thereon, or can be formed by combining sheets of material side-by-side so as to make a single membrane having different surfacings.

In another embodiment, the flexible roofing substrate is a shingle. For example, the shingle can be formed from a bituminous material, which can be reinforced with fibers, glass mat, felt, or fabric, and coated with roofing granules (e.g., in areas outside of the receptor zones). Shingles can be manufactured, for example, using conventional methods, and cut into individual pieces. Shingles can be provided in bundles to a worksite, and can be installed using mechanical fasteners or other suitable methods. Adjacent courses of shingles can be applied in an overlapping manner to cover and protect the roof. The shingles of the present invention can be installed together with conventional shingles, to provide only certain areas of the roof with photovoltaic power generation capability.

Figure 8:
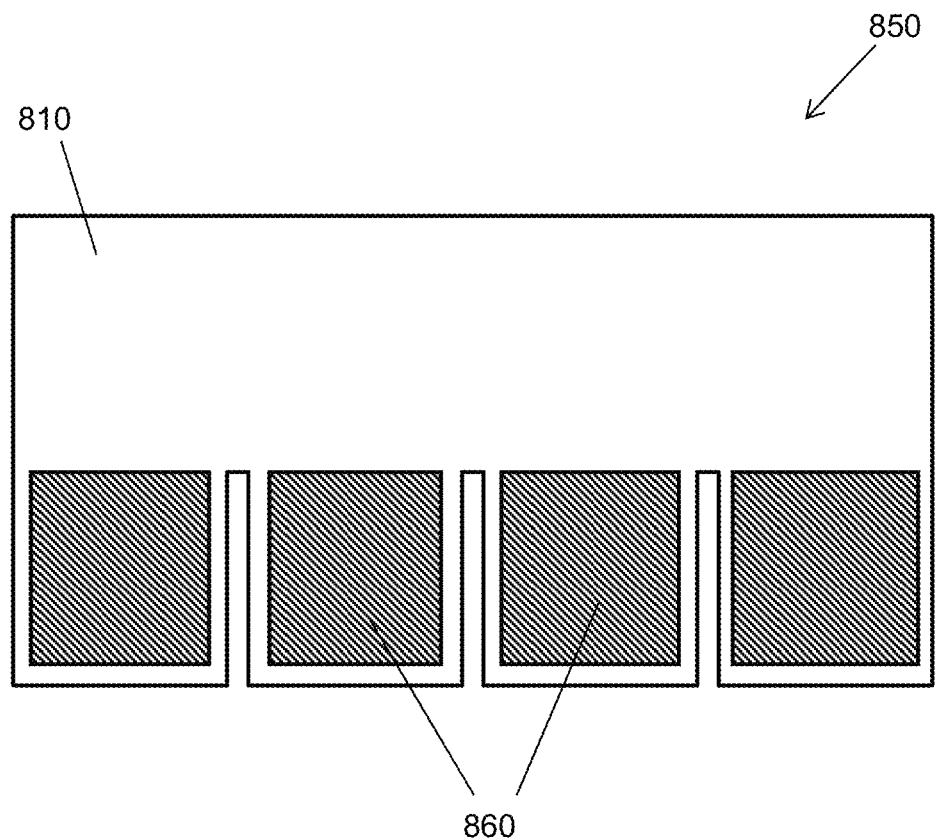
FIG. 8 is a top schematic view and a schematic cross-sectional view of a photovoltaic roofing element according to the invention.
Figure 8:
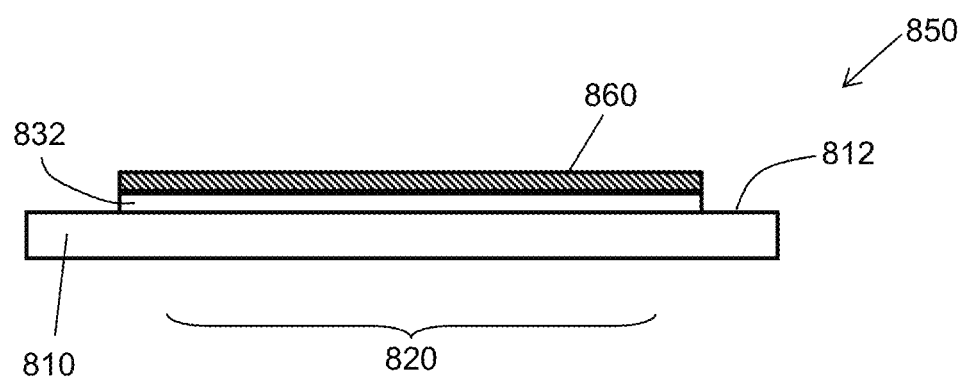

Another aspect of the invention is a photovoltaic roofing element, for example as shown in schematic top perspective view and in partial (i.e., of a single tab) schematic cross-sectional view in FIG. 8. Photovoltaic roofing element 850 includes a flexible roofing substrate 810 having a top surface 812, the top surface having one or more (in this example, four) receptor zones 820 thereon, each receptor zone being adapted to receive one or more photovoltaic elements, each receptor zone having a different surfacing than the area of the top surface adjacent to it, as described above. Photovoltaic roofing element 850 further comprises one or more photovoltaic elements 860 disposed in the one or more receptor zones of the top surface of the flexible roofing substrate. The one or more photovoltaic elements can be adhered to the top surface of the flexible roofing substrate in the receptor zones as described above. For example, as shown in FIG. 8, a tie layer system (e.g., adhesive material) 832 can adhere each photovoltaic element 860 to the top surface 812 of flexible roofing substrate 810 in receptor zones 820. In the receptor zone, the top surface can include, as described above, a polymer or metal film, texturing, or a self-adhesive material (not shown).

In another aspect of the invention, a photovoltaic roofing system comprises one or more photovoltaic roofing elements as described herein disposed on a roof deck. The photovoltaic roofing elements can be disposed with a certain amount of overlap to provide a waterproof covering, as is conventional in the roofing arts. The photovoltaic roofing system can include a wiring system as described above, and as described in U.S. patent application Ser. No. 11/743,073, which is hereby incorporated herein by reference in its entirety. The photovoltaic elements of the photovoltaic roofing elements are desirably connected to an electrical system, either in series, in parallel, or in series-parallel, as would be recognized by the skilled artisan. Electrical connections can be made using electrical connectors, such as those available from Tyco International. There can be one or more layers of material, such as underlayment, between the roof deck and the photovoltaic roofing elements of the present invention. The photovoltaic roofing elements of the present invention can be installed on top of an existing roof; in such embodiments, there would be one or more layers of standard (i.e., non-photovoltaic) roofing elements (e.g., asphalt coated shingles or membrane roofing) between the roof deck and the photovoltaic roofing elements of the present invention. Electrical connections are desirably made using cables, connectors and methods that meet UNDERWRITERS LABORATORIES and NATIONAL ELECTRICAL CODE standards. Even when the photovoltaic roofing elements of the present invention are not installed on top of preexisting roofing materials, the roof can also include one or more standard roofing elements, for example to provide weather protection at the edges of the roof, or in any hips, valleys, and ridges of the roof, or in areas not suitable for photovoltaic power generation.

In certain photovoltaic elements of the invention, at least about 70%, at least about 80%, or even at least about 90% of the total receptor zone area of a flexible roofing substrate is covered by photovoltaic elements.

In certain photovoltaic roofing systems of the invention, at least about 70%, at least about 80%, or even at least about 90% of the total receptor zone area of the flexible roofing substrates is covered by photovoltaic elements.

A tie layer system can be used to adhere the photovoltaic element in the receptor zone of the top surface of the flexible roofing substrate, as described in U.S. patent application Ser. No. 12/266,409, which is hereby incorporated herein by reference in its entirety. The tie layer system can include layers that are provided together with the photovoltaic element, the flexible roofing substrate on which the photovoltaic element is disposed, or both. For example, when the tie layer system is a layer of adhesive material, it can be provided as a layer on the flexible roofing substrate (e.g., as described above with respect to FIG. 4); as a layer of adhesive on the bottom of the photovoltaic element (e.g., exposed by removing a release liner); or both.

In certain embodiments of the invention, the tie layer system is a polymeric tie layer system (i.e., it comprises one or more polymer layers). For example, in one embodiment of the invention, the tie layer system consists of a single polymer layer. In other embodiments of the invention, the tie layer system consists of a plurality of polymer layers. For example, a tie layer system can include an adhesive layer and a reinforcing layer and/or a surface activation layer. Yet in another example, the tie layer system can comprise other layers of structural features, such as woven or nonwoven mat, a fibrous surface, a patterned surface, a nano-structured surface, or blends of various materials to improve the bonding. In some embodiments, the tie layer system has a stratified structure, for example having an upper surface and a lower surface, each of which has different surface chemistry. For example, each surface can be adapted to adhere to a different adherend.

Especially suitable tie layer systems provide sufficient bond strength to join the bottom surface of the photovoltaic element to the top surface of the flexible roofing substrate, and should be able to withstand severe outdoor weathering. In one embodiment of the invention, the tie layer system provides greater than 10 lb/inch adhesive bond strength in a 90° peel test. In certain embodiments, the tie layer system maintains the bond strength in severe outdoor conditions for an extended period of time, e.g., 20 years of service life. The tie layer system can, for example, meet the humidity-freeze cycle test, thermal cycle test, and damp-heat test requirements listed in IEC 1646. Moreover, in certain embodiments the materials of the tie layer system can flexibly be incorporated through use of a variety of adhesive processes.

A polymeric tie layer system can act to adhere the photovoltaic element to the flexible roofing substrate, especially when they are formed of partially incompatible materials (for example, when the photovoltaic element is an encapsulated photovoltaic element having a fluoropolymer at its bottom surface). In one embodiment of the invention, the tie layer system consists of a single polymer layer having a surface tension in the range of about 25% to about 75% of the way between the surface tension value of the top surface of the roofing element and the surface tension value of the bottom surface of the photovoltaic element.

In one embodiment of the invention, the tie layer system includes a polymeric material having a Chang viscoelastic window exhibiting at least one set of coordinates ($\log(G'')$, $\log(G')$) lying within the window bound by the coordinates (4.5, 3), (4.5, 6), (6, 6), (6, 3) (e.g., pressure sensitive adhesives). In certain embodiments of the invention, the polymeric material has a Chang viscoelastic window exhibiting at least one set of coordinates ($\log(G'')$, $\log(G')$) lying within the window bound by the coordinates (4.5, 6), (6, 6), (6, 3.7). In other embodiments of the invention, the polymeric material has a Chang viscoelastic window exhibiting at least one set of coordinates ($\log(G'')$, $\log(G')$) lying within the window bound by the coordinates (4.5, 6), (4.5,8), (8, 8), (8, 3.7), (6, 3.7). In other embodiments of the invention, the polymeric material has a Chang viscoelastic window exhibiting at least one set of coordinates ($\log(G'')$, $\log(G')$) lying within the window bound by the coordinates (4.5, 6), (4.5,8), (8, 8), (8,3.7), (6, 3.7), (6, 6). $G''$ is the viscous shear modulus in units of Pa, and $G'$ is the elastic shear modulus in units of Pa. $G$ and $G''$ can be measured as described in ASTM 882-97, for example at frequencies of 0.01 R/S and 100 R/S. Dissipative materials generally have Chang viscoelastic window coordinates within the above-referenced windows. Such materials are described in more detail in U.S. Pat. No. 6,869,981, and at pages 171-184 of Handbook of Pressure Sensitive Adhesive Technology, 3rd Ed., D. Satas editor, 1999, each of which is hereby incorporated herein by reference in its entirety; the UV curable materials described therein can be converted to heat-curable materials by changing initiators. Other examples include VHB adhesive materials available from 3M.

In certain embodiments of the invention, the tie layer system has a coefficient of thermal expansion ("CTE") between the CTE of the top surface of the flexible roofing substrate and the CTE of the bottom surface of the photovoltaic element, measured at 100° F. In one embodiment of the invention, the tie layer system has a CTE in the range of about 25% to about 75% of the way between the CTE of the top surface of the flexible roofing substrate and the CTE of the bottom surface of the photovoltaic element, measured at 100° F. In one embodiment of the invention, the top surface of the roofing element is bitumen-based with a CTE of $\sim 2.5 \times 10^{-4}$ in/in/° F.

In certain embodiments of the invention, the tie layer materials are not conductive. In such embodiments, the photovoltaic elements do not require additional grounding to prevent electric shock or to meet electrical code requirements.

In some embodiments of the invention, the tie layer system can include one or more materials selected from the group consisting of a polyolefin functionalized with carboxylate and/or anhydride (e.g., maleic anhydride); ethylene vinyl acetate (optionally modified with anhydride); acid-modified polyolefins (e.g., ethylene/(meth)acrylic acid); a combination of an acid-modified polyolefin with an amine-functional polymer; maleic anhydride-grafted EPDM; a hot melt containing a thermoplastic or elastomeric fluoropolymer; and a curable resin (e.g., an epoxy resin such as BondiT from Reltek LLC, or an ethylenically-unsaturated resin), butyl adhesives, or pressure-sensitive adhesives. Examples of such materials are described, for example, in U.S. Pat. Nos. 6,465,103; 6,632,518; 7,070,675; 6,524,671; 5,143,761; and 6,630,047, each of which is hereby incorporated herein by reference in its entirety.

In certain embodiments of the invention, the tie layer system is a blend of functionalized EVA and polyolefin (e.g., polypropylene). For example, the tie layer system can contain 5-75% by weight of polyolefin (e.g., 15-55%). The tie layer system can be, for example, a 70% polypropylene/30% EVA blend, or a 50% polypropylene/50% EVA blend. In other embodiments of the invention, the tie layer system includes (or consists essentially of) an EVA-based PSA (e.g., HB Fuller HL2688PT); EVA (e.g., DuPont Bynel 3860); maleic acid-grafted EVA (e.g., DuPont Bynel E418); maleic acid grafted polypropylene (e.g., Equistar Plexar 6002); an epoxy/maleic acid grafted ethylene/butyl acrylate polymer (e.g., Arkema Lotader AX8900); a blend of polypropylene, PVDF and functionalized EVA-based pressure-sensitive adhesive (e.g., 50% polypropylene, 25% Arkema 2500, 25% HP Fuller 9917); a polyethylene/polypropylene copolymer (e.g., Dow Versify DE2300 having 12% ethylene content); or a functionalized EVA-based pressure-sensitive adhesive (e.g., HP Fuller 9917). In such embodiments, the top surface of the roofing substrate can be, for example, polyolefin (e.g., polypropylene).

In other embodiments of the invention, the tie layer system comprises an amino-substituted organosilane layer, for example as described in U.S. Pat. No. 6,753,087, which is hereby incorporated herein by reference. For example, the tie layer system can comprise a polymeric layer (e.g., having polar functionality) having blended therein an amino-substituted organosilane.

The thickness of the tie layer system can be, for example, in the range of about 25 µm to about 2.5 mm. In certain embodiments of the invention, the thickness of the tie layer system is in the range of about 50 µm to about 1 mm.

Examples of various processes for completing the bonding of the tie layer between the bottom layer of the photovoltaic element and the top surface of the roofing substrate (in the receptor zone) may include, for example, compression molding, injection molding, co-extrusion, lamination, vacuum lamination (e.g., to remove air bubbles and outgassing), ultrasonic welding, vibration welding, laser welding, and IR welding. The method for completing the bonding will depend on whether the bonding is to be completed at a worksite (e.g., after installation of the flexible roofing substrate on a roof deck as described below) or in a factory setting. Equipment intensive processes such as lamination and molding are especially suited to be performed in a factory setting; while use of adhesive materials can be suitable for use on site. In certain embodiments, an adhesive material is provided on the photovoltaic element, the receptor zone, or both, and is covered by a releasable liner, as described above. Peeling the liner can expose the adhesive material, which can adhere the photovoltaic element to the top surface of the roofing substrate.

In some embodiments of this invention, the top surface of the flexible roofing substrate or the bottom surface of the photovoltaic element or both can be surface treated to enhance their affinity to each other, or to the tie layer system, if used. Examples of the surface treatments include flame treatment, plasma treatment, corona treatment, ozone treatment, sodium treatment, etching, ion implantation, electron beam treatment, or combinations thereof. Surface treatments can also include chemical modification with reactive organic species such as polymerizable monomers, or coupling agents such as organosilanes, organozirconates or organotitanates.

In certain embodiments, a mechanical fastener is used together with a tie layer system (e.g., adhesive layer) to attach the photovoltaic element to the receptor zone of the top surface of the flexible roofing substrate. The mechanical fastener can be, for example, nails, staples, screws, clips or the like; such fasteners can attach the photovoltaic element only to the flexible roofing substrate on which it is disposed, or can go through the flexible roofing substrate down to underlying flexible roofing substrates, or even through to the roof deck itself. The mechanical fastener can provide for additional security of attachment of the photovoltaic element under conditions of steep slope or high temperature, where a tie layer system may be subject to shear stresses. The mechanical attachment can be particularly helpful on the lower edge of the photovoltaic element to prevent sliding movement down the roof. Moreover, mechanical attachment at the lower edge may impart added resistance to wind uplift detachment of the photovoltaic element or the flexible roofing substrate. Mechanical attachment at one edge of the photovoltaic element can also allow a degree of movement within the tie layer system to accommodate differential thermal expansion and contraction between the photovoltaic element and the flexible roofing substrate.

Figure 9:
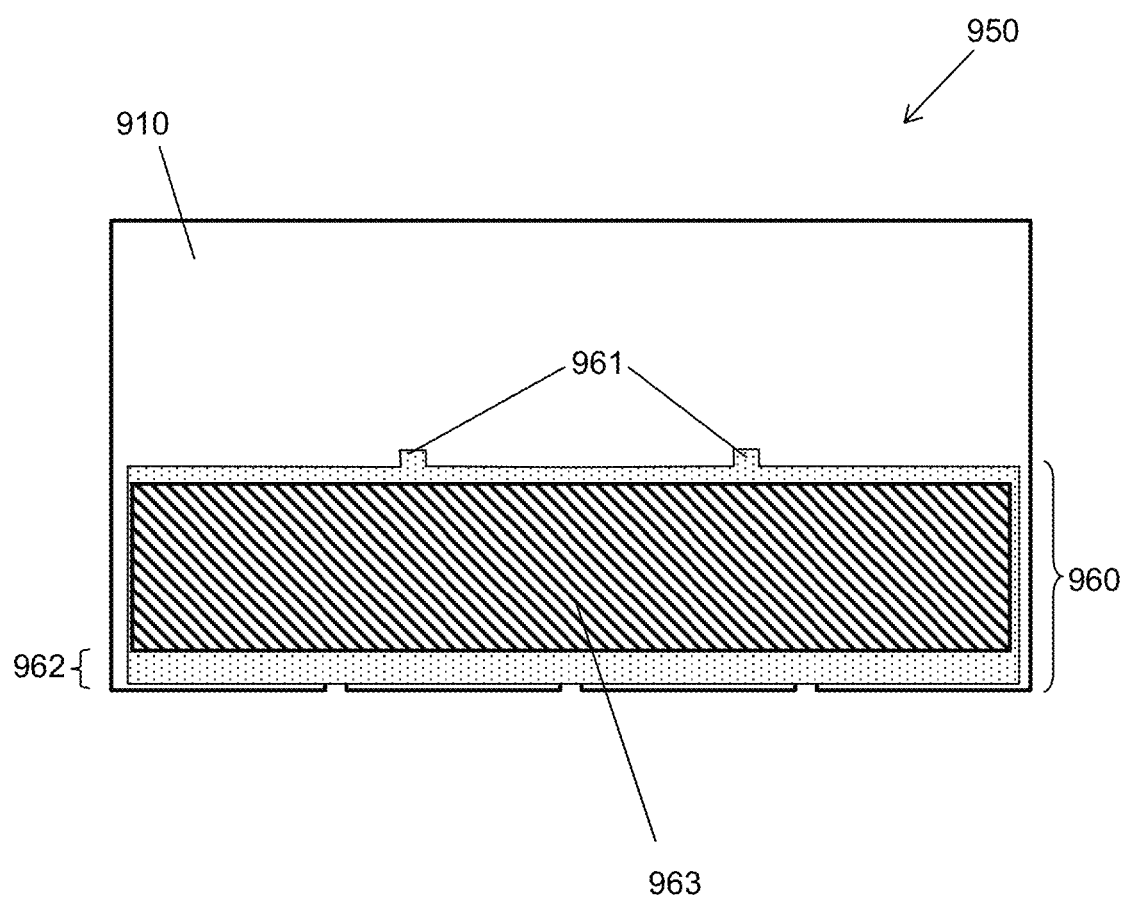
FIG. 9 is a schematic top perspective view of a photovoltaic element according to one embodiment of the invention.

In some embodiments, the photovoltaic element will include fastening tabs or a fastening zone (e.g., a marked area) to aid in the attachment of the photovoltaic element to the receptor zone of the top surface of the flexible roofing substrate. Fastening zones and tabs may be configured using a flexible material, such as described in U.S. Pat. Nos. 5,729,946; 5,857,303; 5,887,743; 5,857,303 and 6,000,185, each of which is hereby incorporated by reference in its entirety. Flexible fastening zones can help to accommodate movement between the photovoltaic element and the flexible roofing substrate, for example due to differential thermal expansion. For example, in one example of a photovoltaic roofing element 950 of the invention, shown in top perspective view in FIG. 9, photovoltaic element 960 (having photovoltaically active area 963) is disposed in the receptor zones of flexible roofing substrate 910. Photovoltaic element 960 includes both fastening tabs 961 and a fastening zone 962. The fastening tabs 961 and fastening zone 962 denote places that where fastening will cause no damage to the photovoltaic element (e.g., areas devoid of photovoltaic cells or electrical components such as wiring). The fastening tabs can in some embodiments be covered by an overlying course of flexible roofing substrates (e.g., shingles). In certain embodiments, the photovoltaic element includes fastening tabs (e.g., as denoted by 961 in FIG. 9), but no other fastening zone.

Figure 10:
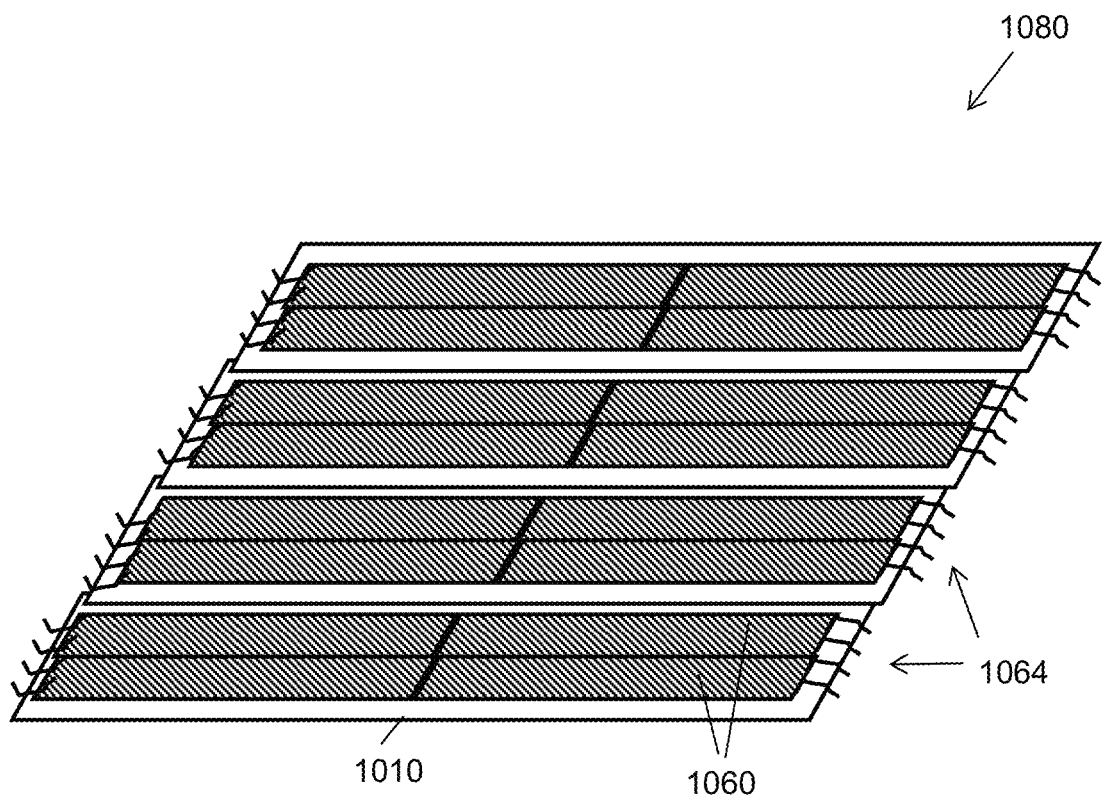
FIG. 10 is a top perspective schematic view of a photovoltaic roofing system according to the invention.

In one embodiment of the invention, shown in schematic top perspective view in FIG. 10, each flexible roofing substrate 1010 is a length of roofing membrane, four of which are shown applied to a roof deck (not shown) in overlapping strips to form a photovoltaic roofing system 1080. A receptor zone is disposed longitudinally on the top surface of each flexible roofing substrate, spaced somewhat away from the lateral edges. The dimensions of the receptor zones can be selected to accommodate one or more desired photovoltaic elements. For example, certain currently available roofing membranes (e.g., from CertainTeed Corporation) are about 1 m in width and about 10 m in length. One currently available photovoltaic element is an encapsulated photovoltaic strip, about 40 cm in width and about 5 m in length. Accordingly, up to four such photovoltaic strips 1060 can fit in an appropriately-sized receptor zone on each flexible roofing substrate 1010. In certain embodiments, the photovoltaic elements have one or more electrical connections (e.g., electrodes, electrical connectors, wires or cables optionally terminated with connectors). The electrical connections can be used to interconnect the photovoltaic element with other photovoltaic elements or with a wiring system for take-off of electrical power. In FIG. 10, the photovoltaic strips 1060 have connectorized wires 1064 at one of their longitudinal ends. In the embodiment of FIG. 10, the electrical connections (1064) are at a longitudinal end of the flexible roofing substrate 1010.

In certain embodiments, the lengths of the photovoltaic elements and the roofing membrane are chosen so that the length of the roofing membrane is slightly greater than twice (e.g., 200-220% of) the length of the photovoltaic elements. In one embodiment, the photovoltaic elements are disposed in the receptor zone(s) so that at least one of the elements has an electrical connection at a longitudinal end of the roofing membrane, as shown in FIG. 10. In another embodiment, the photovoltaic elements are disposed so that at least one of the photovoltaic elements has an electrical connection at the longitudinal center of a roofing membrane. At the point where electrical connections are to be made, a wiring system or bus system can be provided to collect the electrical power generated by the photovoltaic elements.

In embodiments in which multiple photovoltaic elements are disposed adjacent to one another in a receptor zone, waterproofing may be provided via an optional bead of an adhesive, caulk or other sealant between adjacent photovoltaic elements. Alternatively, a pressure sensitive adhesive tape with a backing layer stabilized for outdoor performance can be used to seal the seams between adjacent photovoltaic elements.

In another embodiment, the flexible roofing substrate is a shingle (e.g., as shown in FIG. 8). Shingles can, for example, be provided in product constructions that have a single layer of bituminous shingle material. In other embodiments, multilayer laminated shingle constructions can be used. Laminated shingles can provide for a wide range of aesthetic effects in shingle design, as well as provide space within the shingle to accommodate wiring and electrical connector structures. Laminated shingles can yield a flatter laying product without undesirable bumps when installed.

Figure 11:
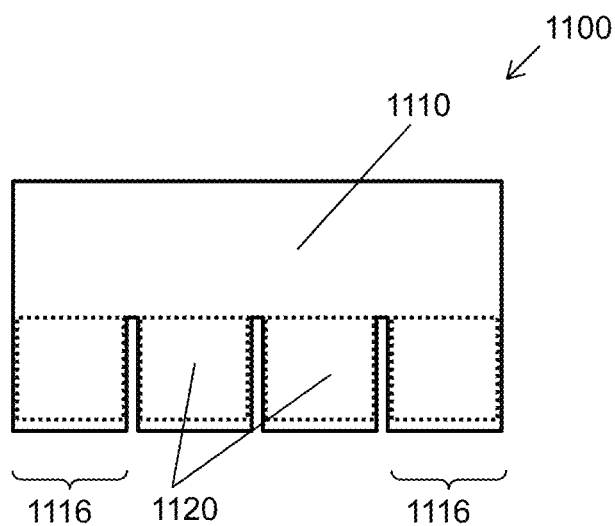
FIGS. 11-13 are top schematic views of roofing products according to the present invention.
Figure 12:
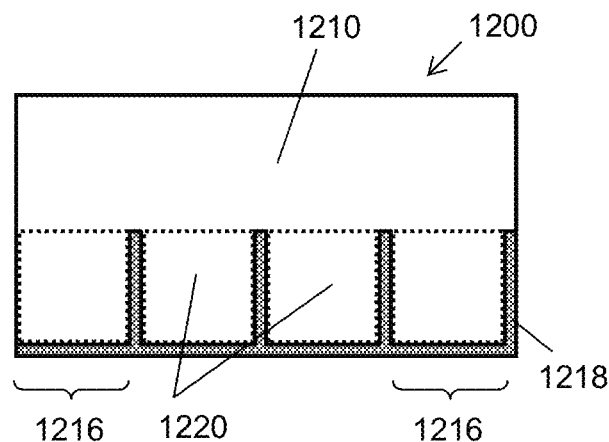
Figure 13:
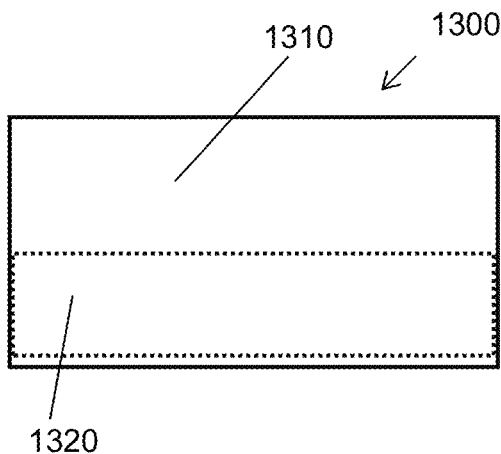

For example, in the roofing product 1100 of FIG. 11, shingle 1110 has four tab areas 1116, each having a receptor zone 1120 formed thereon, on which a photovoltaic element can be disposed. In the roofing product 1200 of FIG. 12, shingle 1210 has four tab areas 1216, each having a receptor zone 1220 formed thereon. Roofing product 1200 also includes a backing shim 1218 (i.e., a second thickness of shingle material) laminated to the bottom of shingle 1210. The backing shim can provide an aesthetic effect delineating the tabs and create the illusion of shadows and structure, as well as well as providing another layer of material to cover a roof. The backing shim can underlay the entire shingle, or alternatively can underlay only part of the shingle. In other embodiments, as in the roofing product 1300 shown in FIG. 13, the shingle 1310 need not have any individual tabs, and can have a single receptor zone 1320 formed thereon. The receptor zone(s) can be formed to cover the entire exposure area of the shingle. In other embodiments, roofing granules (e.g., colored and/or solar reflective) can be disposed on exposed areas of the shingle. Lower cost granules can be used in the headlap zones that would be covered when the shingle is installed on a roof.

Figure 14:
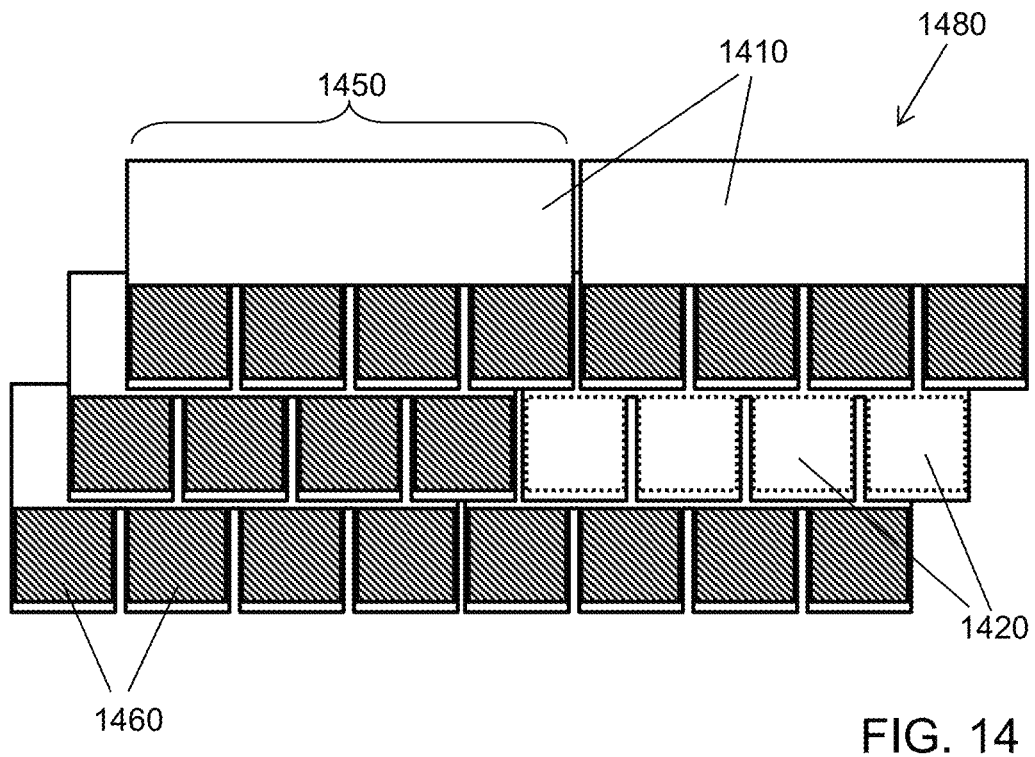
FIG. 14 is a top schematic view of a photovoltaic roofing system according to one embodiment of the invention.

Photovoltaic roofing elements based on shingles can be arrayed on a roof deck in a variety of ways. For example, in the photovoltaic roofing system 1480 shown in top schematic view in FIG. 14, photovoltaic roofing elements 1450 are arrayed as laterally-offset courses of shingles. Each flexible roofing substrate 1410 is a four-tab shingle, with a receptor zone 1420 (shown exposed on one shingle) on each tab. Photovoltaic elements 1460 are disposed in the receptor zones 1420. In one example, a shingle similar to the Grand Manor® Shangle®, available from CertainTeed Corporation, has a shingle exposure height of 8 inches and an overall shingle dimension of 18 inches by 36 inches, with four tabs in the exposure area. Each of the tabs has a receptor zone having a coating of small particle sand in place of conventional roofing granules. A T-cell photovoltaic element (Uni-Solar Ovonic) equipped with a pressure-sensitive adhesive is attached to each of the receptor zones of each shingle.

Figure 15:
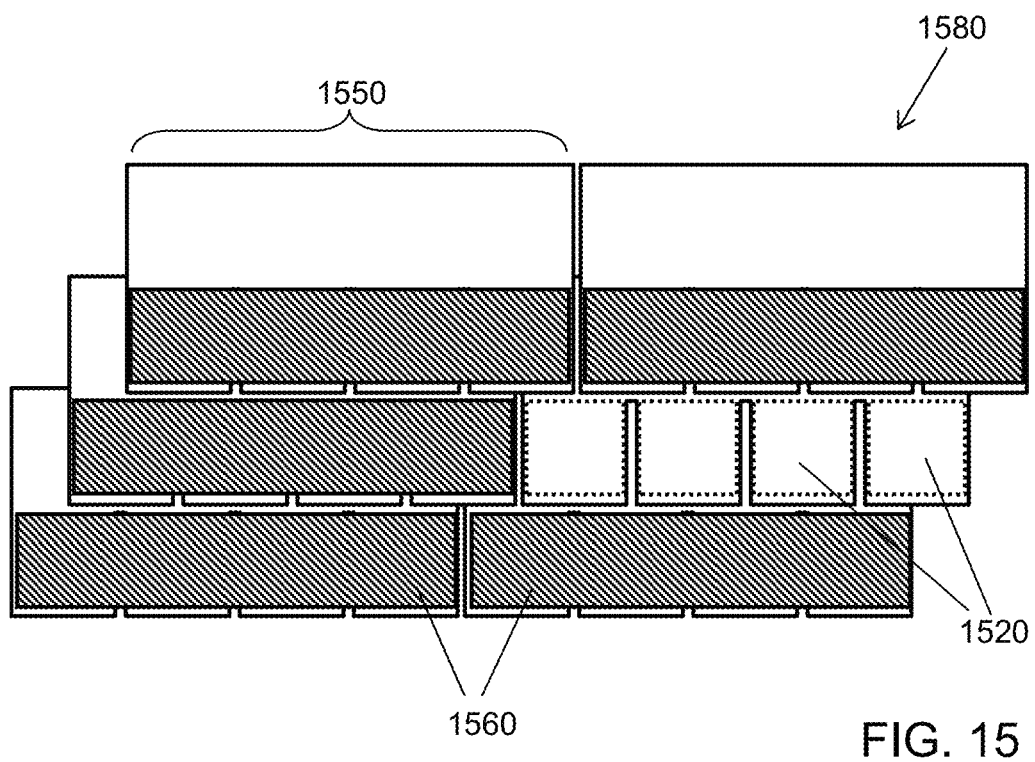
FIG. 15 is a top schematic view of a photovoltaic roofing system according to another embodiment of the invention.

As described above, more than one photovoltaic element may be disposed on each receptor zone. Similarly, a single photovoltaic element may be disposed on more than one receptor zone. For example, in the photovoltaic roofing system 1580 of FIG. 15, photovoltaic roofing elements 1550 are provided and arrayed as described above with reference to FIG. 14. Each photovoltaic element 1560 extends across and is disposed on the receptor zones 1520 (shown exposed on one shingle) of all four tabs of the shingle on which it is disposed. Each photovoltaic element can be, for example, a strip of four electrically interconnected T-cell photovoltaic elements in a laminate structure, with a pressure-sensitive adhesive on the bottom surface of the laminate structure.

Figure 16:
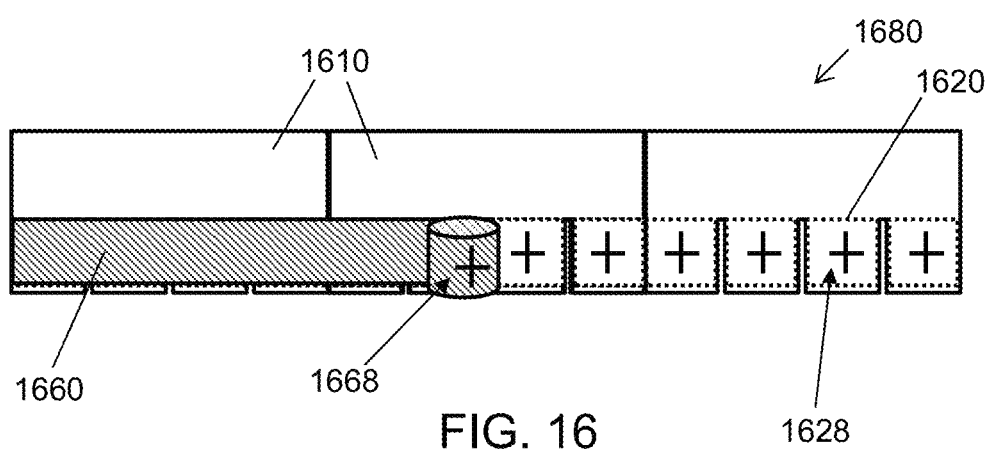
FIG. 16 is a top schematic view of a photovoltaic roofing system according to another embodiment of the invention.

In certain embodiments, in shingles similar to those described above with respect to FIG. 14, the receptor zone spans the length of the exposed section of each shingle. The shingles can be applied (e.g., in a typical fashion) by a roofing professional, who need not have any particular expertise with respect to photovoltaic systems. One or more extended length photovoltaic elements can then be disposed in the receptor zones as described above, spanning the length of a plurality of shingles). For example, the Grand Manor® Shangle® exposure height of 8 inches could be entirely covered by the photovoltaic element. In the photovoltaic roofing system 1680 shown in FIG. 16, a course of three shingles 1610 is arrayed on a roof deck. The shingles have receptor zones 1620, which include alignment marks 1628 as described above. The photovoltaic element 1660 is provided as a strip, in roll form, and has alignment marks 1668 on its bottom surface. As the photovoltaic element is unrolled and disposed on the receptor zones, the installer can align the alignment marks on the photovoltaic element with those on the receptor zone to ensure proper placement. Of course, alignment marks could alternatively (or also) be provided on the releasable liner.

In certain embodiments of the invention, a receptor zone can have disposed therein a piece of roofing material (e.g., roofing membrane, asphalt shingle). In some cases (e.g., for aesthetic reasons or to avoid putting photovoltaic elements in shaded areas), it may not be desired to equip a given receptor zone with a photovoltaic element. The roofing material can further protect the receptor zone from weathering, and better match the appearance of the unused receptor zone with the rest of the roof. The roofing material can be, for example, an appropriately-sized piece of roofing membrane or asphalt shingle having on its bottom surface an adhesive layer covered by a releasable liner. The installer can peel-and-stick the pieces of roofing material to the desired receptor zones. In certain photovoltaic roofing systems of the invention, at least about 70%, at least about 80%, or even at least about 90% of the total receptor zone area of the flexible roofing substrates is covered by photovoltaic elements and/or pieces of roofing material.

Figure 17:
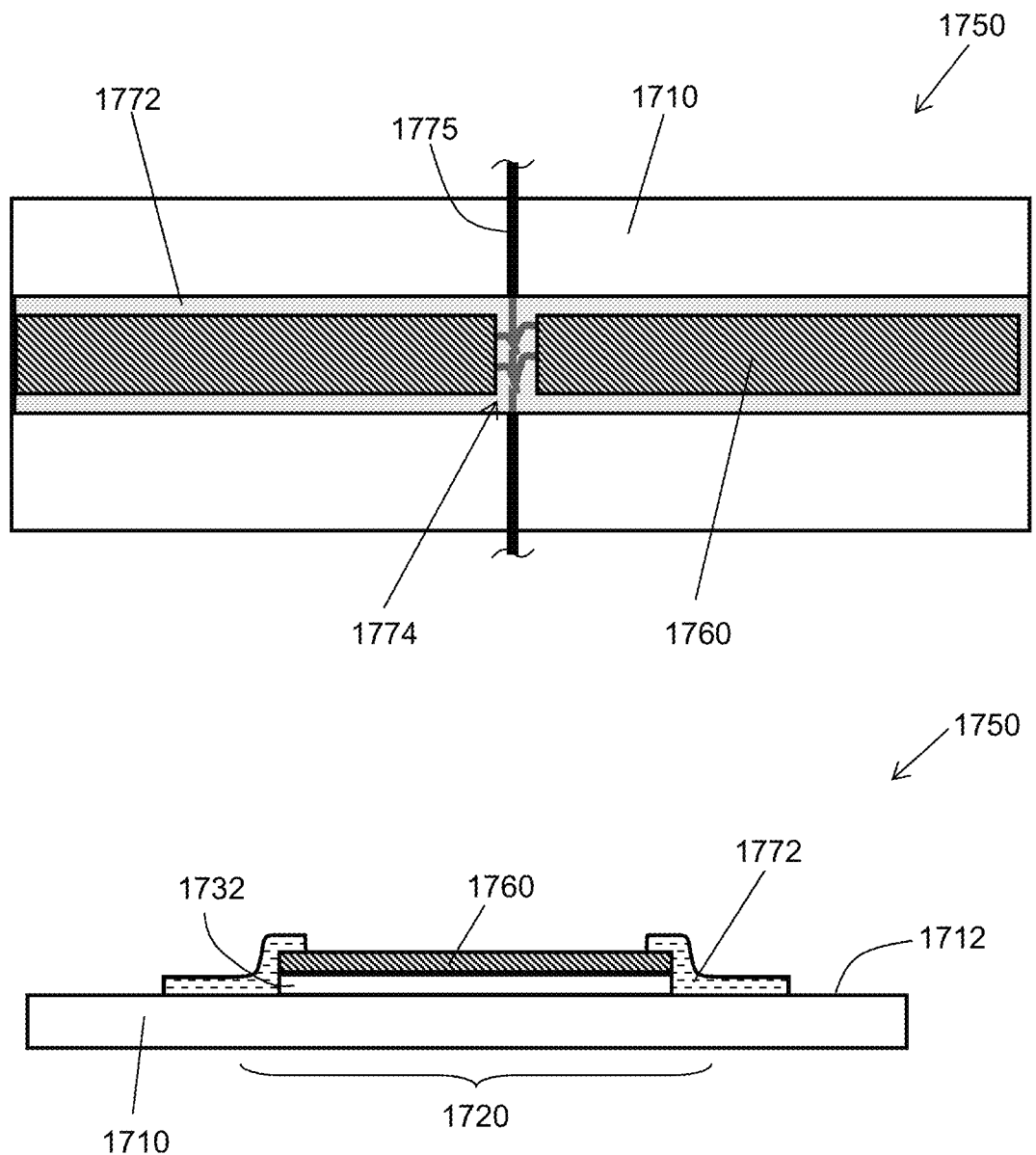
FIG. 17 is a schematic top view and in schematic cross-sectional view of a photovoltaic roofing element according to one embodiment of the invention.

In certain embodiments, a cap layer is disposed on the flexible roofing substrate. For example, as shown in schematic top view and in schematic cross-sectional view in FIG. 17, a cap layer can be disposed on the flexible roofing substrate to cover areas of the receptor zone in which a photovoltaic element is not disposed. In the photovoltaic roofing element 1750 of FIG. 17, flexible roofing substrate 1710 has a receptor zone 1720 on its top surface 1712. Affixed to in the receptor zone (through adhesive layer 1732), but not covering it completely, are two photovoltaic elements 1760. Cap layer 1772 is disposed on the top surface 1712 of flexible roofing substrate 1710 to cover areas of the receptor zone 1720 in which a photovoltaic element 1760 is not disposed. As shown in FIG. 17, a cap layer can also cover electrical connections (e.g., electrical connections 1774 to electrical cable 1775), thereby protecting them from the elements. Notably, a cap layer can cover electrical connections and/or wiring systems even when it is not used to cover exposed areas of a receptor zone. In other embodiments, a cap layer can seal the edges of a joint between the photovoltaic element(s) and the flexible roofing substrate, whether or not the photovoltaic element(s) cover the entire receptor zone. For example, as shown in FIG. 17, cap layer 1772 seals the joint between the flexible roofing substrate 1712 and the photovoltaic elements 1760. The cap layer can be provided in individual pieces (e.g., tape-shaped strips), or as a single piece. For example, in certain embodiments, the cap layer can be provided as a single piece with cutout areas to expose the photovoltaically active areas of the photovoltaic elements. The cap layer can be provided, for example, as roofing membrane (e.g., self-adhesive, such as that available from CertainTeed Corporation), shingle material, or other materials. The cap layer can alternatively be provided as a roof coating. Such roof coatings are known in the art, and can also provide other attributes to the roof, such as reflectivity of solar radiation. Coatings can be formed, for example, from acrylic or fluorinated polymers, or latex-based materials. A cap layer can cover one or more photovoltaic roofing elements.

Figure 18:
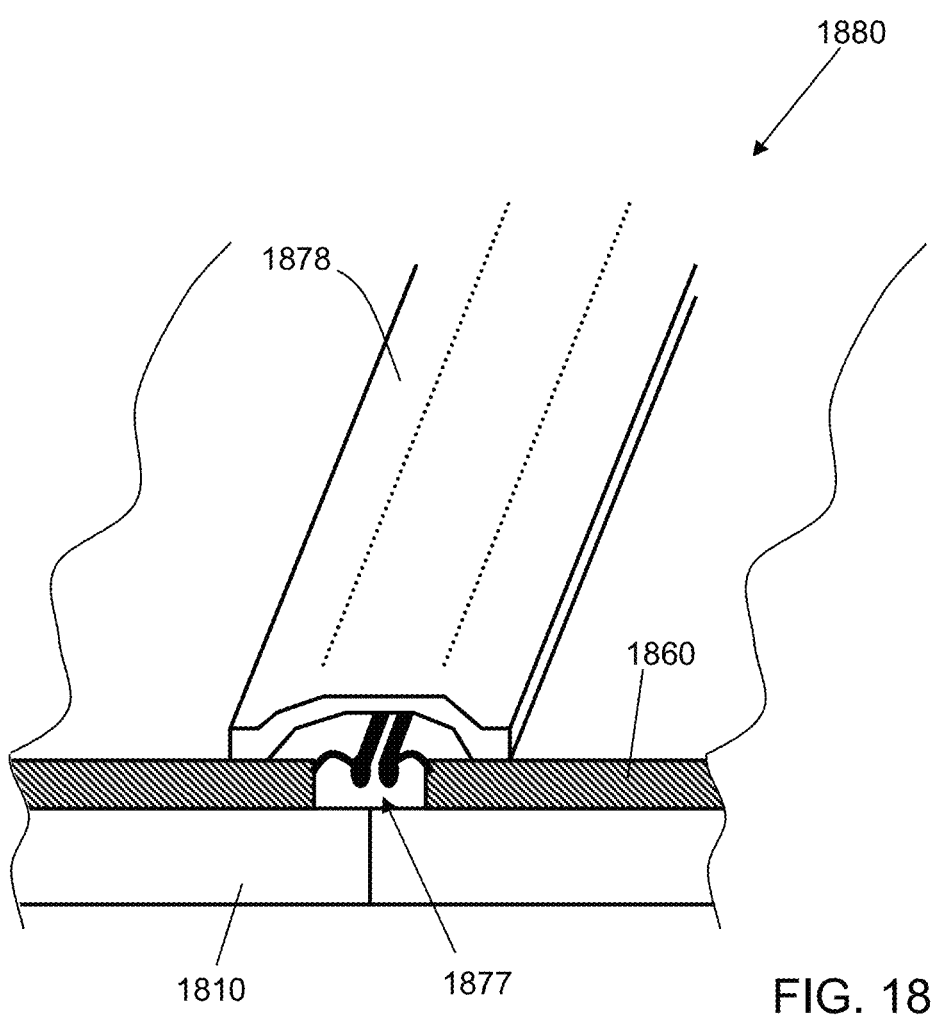
FIG. 18 is a partial schematic cross-sectional/perspective view of a photovoltaic roofing system according to one embodiment of the invention.

In certain embodiments, a protective conduit covers the wiring interconnecting the photovoltaic elements, thereby protecting it from the elements, for example as shown in FIG. 18. In the photovoltaic roofing system 1880 shown in partial schematic cross-sectional/perspective view FIG. 18, the conduit 1878 is at the junction of two adjacent roofing membranes 1810, and covers wiring system 1877 that interconnects photovoltaic elements 1860. In other embodiments, the conduit can be disposed in the middle part of a membrane (e.g., between the connectorized ends of the horizontally-arranged photovoltaic elements). Of course, a conduit can also be used with a shingle-based photovoltaic roofing system. The conduit can, for example, be similar in structure to a wire covering product such as is commonly used for covering wires or cables on floors in office environments. Of course, the conduit can take any of a number of other forms, such as round or rectangular tube. A cap layer (e.g., protective tape or cover sheet) comprising a suitable roof covering material can also be applied over a conduit so as to provide a desired aesthetic effect or weathering protection to the conduit. A cap layer can also or alternatively be disposed within the conduit to provide further protection.

Figure 19:
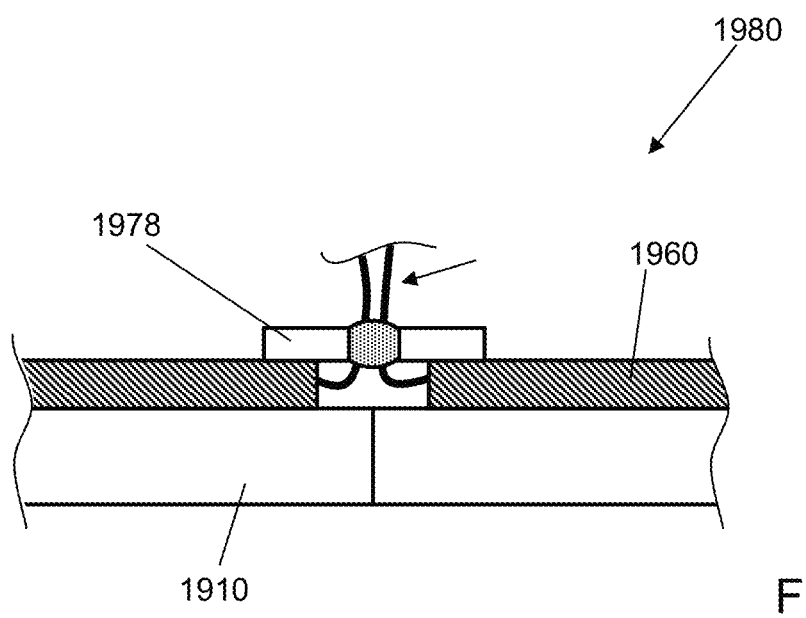
FIG. 19 is a partial schematic cross-sectional view of a photovoltaic roofing system according to another embodiment of the invention.

In another embodiment, a protective covering is disposed over the electrical connections. As shown in partial schematic cross-sectional view in FIG. 19, the protective covering can have holes formed therein near the electrical connections of the photovoltaic elements, so that wires for connection to an electrical system can pass through the holes to a wiring system for collection of the power generated by the photovoltaic elements. In the photovoltaic roofing system 1980 of FIG. 19, the protective cover 1978 covers cables 1976 that interconnects photovoltaic elements 1960 (disposed on roofing membranes 1910) into a wiring system. The holes can be sealed with an appropriate adhesive or sealant, such as a butyl, a mastic, or a neoprene adhesive. The wiring system can be provided in a conduit, which can be mounted within the roofing system and covered by a conventional roofing material strip or tape. Alternatively, the conduit can be mounted above the surface of the roof in the vicinity of the electrical connections of the photovoltaic elements. For example, a conduit could be provided as a tube of any desired geometry) supported on legs which have pitch pockets filled with tar, adhesive, caulk, or the like to accommodate dimensional changes or vibrational effects experienced during use, this minimizing transfer of forces to the wiring system.

In other embodiments, individual photovoltaic elements are electrically interconnected in series, with sets of series-connected photovoltaic elements being connected to a wiring system or a bus system (e.g., within a conduit) along one or more edges of a roof section.

Photovoltaic roofing elements of the present invention can be fabricated using many techniques familiar to the skilled artisan. Roofing substrates can be made using a variety of techniques. For example, when the roofing substrate is an asphalt shingle or an asphalt non-woven glass reinforced laminate, the person of skill in the art can use methods described in U.S. Pat. Nos. 5,953,877; 6,237,288; 6,355,132; 6,467,235; 6,523,316; 6,679,308; 6,715,252; 7,118,794; U.S. Patent Application Publication 2006/0029775; and International Patent Application Publication WO 2006/121433, each of which is hereby incorporated herein by reference in its entirety. Photovoltaic roofing elements can be fabricated in a continuous process and then cut into individual elements as is done in the fabrication of asphalt shingles. When a continuous process is used, it can be necessary to individually prepare any electrical cables running between elements, for example by cutting the cables between elements and adding connectors to the cut ends.

In certain embodiments, the present invention may also be practiced using techniques described in U.S. Patent Application Publication nos. 2005/0072456 and 2004/0144043, and in U.S. Pat. No. 4,860,509, each of which is hereby incorporated herein by reference in its entirety.

Another aspect of the invention is a method for installing a photovoltaic roofing system on a roof deck. First, one or more flexible roofing substrates as described above are installed on a roof deck. Then, one or more photovoltaic elements are disposed in the one or more receptor zones of the top surface of the flexible roofing substrate. The flexible roofing substrates can be installed robustly in a rugged manner to cover the roof; this step can be performed by a roofing professional, who need not have any particular expertise with respect to photovoltaic systems. The one or more photovoltaic elements can then be disposed in the receptor zones as described above. For example, when the photovoltaic element, the flexible roofing substrate, or both have releasable liners covering an adhesive material, the releasable liner can be removed, and the photovoltaic elements affixed to the flexible roofing substrate. In certain embodiments, one or more cap layers as described above are disposed on the flexible roofing substrates after the photovoltaic elements are disposed thereon.

Another benefit derived in certain embodiments of the invention is that when photovoltaic elements are separately installed on a roof, it is possible to test the performance of the photovoltaic elements before they are attached to the shingles. Such testing can be performed, for example, immediately prior to attachment, so that any faulty photovoltaic elements are discovered before they are attached to the flexible roofing substrate.

The flexible roofing elements can be applied to the roof deck in bottom-up manner (i.e., from the lower edge of the roof to the upper edge), as is conventional. The photovoltaic elements can then be installed, for example, from the top of roof to the bottom. Top-down installation can allow the more fragile and potentially slippery photovoltaic elements to be applied in a more gentle manner, and without the need for an installer to walk on already-installed photovoltaic elements. Of course, the photovoltaic elements can be installed in any other convenient order.

Of course, in other embodiments, the photovoltaic elements are disposed on the flexible roofing substrate before the flexible roofing substrate is installed on the roof. For example, the photovoltaic elements can be disposed on the flexible roofing substrate at the worksite, but before installation. This can allow the individual materials to be transported more efficiently, and be put together to fit the particular dimensions of the roof. In other embodiments, the photovoltaic elements can be disposed on the flexible roofing substrate in a factory setting. In such embodiments, the use of a flexible roofing substrate with a receptor zone can increase adhesion of the photovoltaic roofing element without sacrificing properties of the rest of the flexible roofing substrate, and can increase process flexibility during manufacture.

In certain embodiments, the photovoltaic elements are provided with removable cover elements covering their photovoltaically-active areas, as described in U.S. patent application Ser. No. 12/145,166, which is hereby incorporated herein by reference in its entirety. The removable cover elements can be removed after installation to expose the photovoltaically active areas. Moreover, in embodiments in which a roofing coating (e.g., a solar reflective coating) is disposed on roof as described above, the removable cover elements can be removed after the roofing coating is applied. In such embodiments, the roofing coating can be applied over the entire roof, and can help to waterproof the seams between the photovoltaic elements and the flexible roofing substrates.

Another aspect of the invention is a kit for the installation of a photovoltaic roofing system, the kit comprising one or more flexible roofing substrates as described above; and one or more photovoltaic elements. The one or more photovoltaic elements can be selected to be compatible, both in size and in adhesive characteristics as described above, with the flexible roofing substrates.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. A method for making a photovoltaic roofing element comprising a flexible roofing substrate and one or more photovoltaic elements each disposed on the flexible roofing substrate and affixed thereto by an adhesive material, the method comprising:
   providing a flexible roofing substrate, the flexible roofing substrate having a top surface, the top surface having one or more receptor zones thereon, each of the one or more receptor zones having a different surfacing than the area of the top surface adjacent to it, each of the one or more receptor zones being adapted to receive the one or more photovoltaic elements, but having no photovoltaic elements disposed thereon;
   installing the flexible roofing substrate on a roof; and then, while the flexible roofing substrate is disposed on the roof, disposing the one or more photovoltaic elements on the top surface of the flexible roofing substrate, such that each of the one or more photovoltaic elements is disposed on one or more of the one or more receptor zones of flexible roofing substrate and affixed thereto by the adhesive material.

2. The method according to claim 1, wherein the flexible roofing substrate is a bituminous substrate.

3. The method according to claim 2, wherein, before installation of the flexible roofing substrate on the roof and before disposal of the one or more photovoltaic elements on the top surface of the flexible roofing substrate, the surfacing of the one or more receptor zones of the installed flexible roofing substrate is uncoated bituminous material.

4. The method according to claim 3, wherein, before installation of the flexible roofing substrate on the roof, the uncoated bituminous material of each of the one or more receptor zones is covered by a releasable liner, and wherein the method includes, before disposal of the one or more photovoltaic elements on the top surface of the flexible roofing substrate, removing each of the releasable liners.

5. The method according to claim 1, wherein, before disposal of the one or more photovoltaic elements on the top surface of the flexible roofing substrate, the surfacing of the one or more receptor zones comprises particulate matter, a fabric, a scrim, a woven or nonwoven web.

6. The method according to claim 1, wherein, before disposal of the one or more photovoltaic elements on the top surface of the flexible roofing substrate, the surfacing of the one or more receptor zones comprises a metal foil or a polymer film.

7. The method according to claim 1, wherein when the flexible roofing substrate is installed on the roof each of the receptor zones has no adhesive material disposed thereon, and wherein the method further comprises, after installing the flexible roofing substrate on the roof, disposing an adhesive material on one or more of the receptor zones, and wherein the step of disposing the one or more photovoltaic elements on the top surface of the flexible roofing substrate results in the adhesive material being disposed between each photovoltaic element and the receptor zone on which it is disposed.

8. The method according to claim 1, wherein, before disposal of the one or more photovoltaic elements on the top surface of the flexible roofing substrate, the surfacing of the one or more receptor zones comprises an adhesive material.

9. The method according to claim 8, wherein the step of providing the flexible roofing substrate comprising the one or more receptor zones having as their surfacing an adhesive material comprises
providing the flexible roofing substrate comprising the one or more receptor zones each including an adhesive material covered by a releasable liner, and
before disposal of the one or more photovoltaic elements on the top surface of the flexible roofing substrate, removing each of the releasable liners.

10. The method according to claim 1, wherein the surfacing of the receptor zone is stabilized to UV radiation.

11. The method according to claim 1, wherein the top surface of the flexible roofing substrate in the receptor zone is recessed from the top surface of the flexible roofing substrate in the area adjacent to the receptor zone.

12. The method according to claim 1, wherein the top surface of the flexible roofing substrate has solar reflective properties.

13. The method according to claim 1, wherein the surfacing of the one or more receptor zones or the top surface of the flexible roofing substrate in the area adjacent the one or more receptor zones includes one or more alignment marks.

14. The method according to claim 1, further comprising mechanically fastening the one or more photovoltaic elements to the flexible roofing substrate.

15. The method according to claim 14, wherein each of the one or more photovoltaic elements includes a fastening zone or one or more fastening tabs.

16. The method according to claim 1, further comprising disposing a cap layer on the flexible roofing substrate to cover an area of one of the receptor zones in which no photovoltaic element is disposed.

17. The method according to claim 1,
wherein the flexible roofing substrate is a bituminous substrate,
before disposal of the one or more photovoltaic elements on the top surface of the flexible roofing substrate, the surfacing of the one or more receptor zones of the installed flexible roofing substrate is uncoated bituminous material, and
wherein the top surface of the flexible roofing substrate is coated with roofing granules in areas outside the one or more receptor zones, such that the area of the top surface adjacent each of the one or more receptor zones is coated with roofing granules.

18. The method according to claim 17, wherein before installation of the flexible roofing substrate on the roof, the uncoated bituminous material of each of the one or more receptor zones is covered by a releasable liner, and wherein the method includes, before disposal of the one or more photovoltaic elements on the top surface of the flexible roofing substrate, removing each of the releasable liners.

19. The method according to claim 1, wherein when the flexible roofing substrate is installed on the roof, each of the one or more receptor zones is adapted to receive the one or more photovoltaic elements, but has no photovoltaic elements and no adhesive disposed thereon.

* * * * *